(12) United States Patent
Edwards

(10) Patent No.: US 11,804,587 B2
(45) Date of Patent: Oct. 31, 2023

(54) LIGHT EMITTING DIODE COOLING WITH TURBULENT FLOW

(71) Applicant: NBCUniversal Media, LLC, New York, NY (US)

(72) Inventor: Charles Edwards, Mesa, AZ (US)

(73) Assignee: NBCUniversal Media LLC, New York, NY (US)

( * ) Notice: Subject to any disclaimer, the term of this patent is extended or adjusted under 35 U.S.C. 154(b) by 0 days.

(21) Appl. No.: 17/704,818

(22) Filed: Mar. 25, 2022

(65) Prior Publication Data

US 2022/0344558 A1 Oct. 27, 2022

Related U.S. Application Data

(60) Provisional application No. 63/178,344, filed on Apr. 22, 2021.

(51) Int. Cl.
| | | |
|---|---|---|
| *H01L 33/64* | (2010.01) | |
| *F21V 29/503* | (2015.01) | |
| *F21V 29/58* | (2015.01) | |
| *F21Y 115/10* | (2016.01) | |

(52) U.S. Cl.
CPC .......... *H01L 33/648* (2013.01); *F21V 29/503* (2015.01); *F21V 29/59* (2015.01); *F21Y 2115/10* (2016.08)

(58) Field of Classification Search
CPC ....... F21V 29/503; F21V 29/59; H01L 33/648
See application file for complete search history.

(56) References Cited

U.S. PATENT DOCUMENTS

| | | | |
|---|---|---|---|
| 8,651,704 B1 | 2/2014 | Gordin et al. | |
| 2002/0074105 A1* | 6/2002 | Hayashi | F28F 13/12 |
| | | | 165/43 |
| 2005/0253252 A1* | 11/2005 | Owen | H01L 23/473 |
| | | | 257/E23.098 |
| 2013/0146955 A1 | 6/2013 | Avenas et al. | |
| 2015/0276147 A1* | 10/2015 | Vasta | F21V 5/08 |
| | | | 362/241 |
| 2020/0003354 A1* | 1/2020 | Kanres | F16L 55/18 |
| 2021/0013390 A1 | 1/2021 | Vanderwees et al. | |

OTHER PUBLICATIONS

Extended European Search Report for EP22169494.6 dated Sep. 22, 2022, 9 pages.

* cited by examiner

*Primary Examiner* — Evan P Dzierzynski
*Assistant Examiner* — Nathaniel J Lee
(74) *Attorney, Agent, or Firm* — Fletcher Yoder, P.C.

(57) ABSTRACT

A cooling system for a light emitting diode ("LED") assembly includes a fluid configured to absorb heat at the LED assembly, a heat exchanger coupled to one or more substrates of the LED assembly, where the heat exchanger is configured to exchange heat between the LED assembly and the fluid, and a pump configured to circulate the fluid along the LED assembly and the heat exchanger, where the fluid exhibits a turbulent flow at the LED assembly, the heat exchanger, or both, while circulated by the pump.

20 Claims, 21 Drawing Sheets

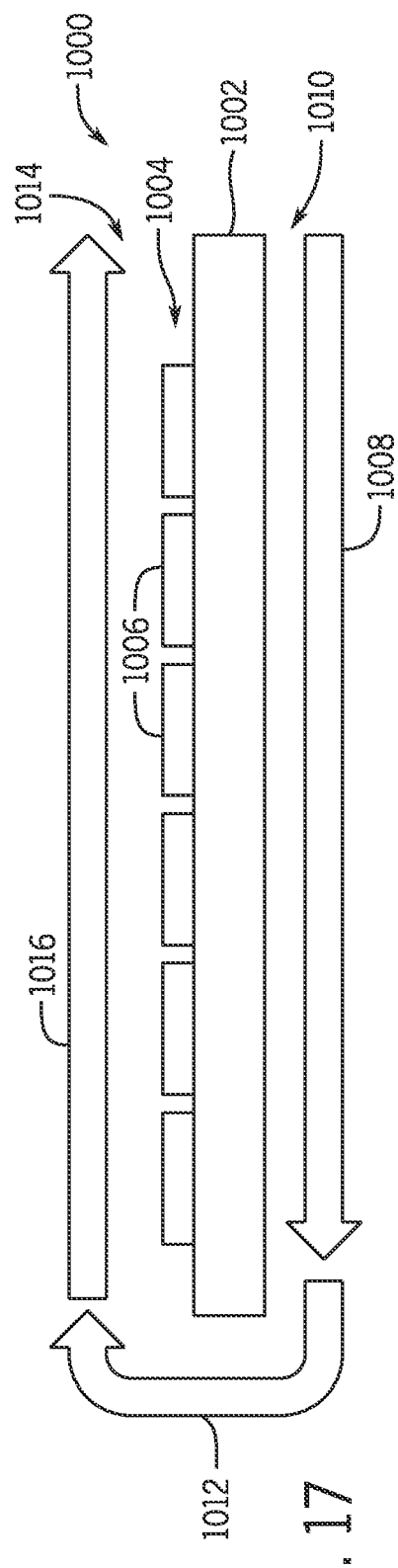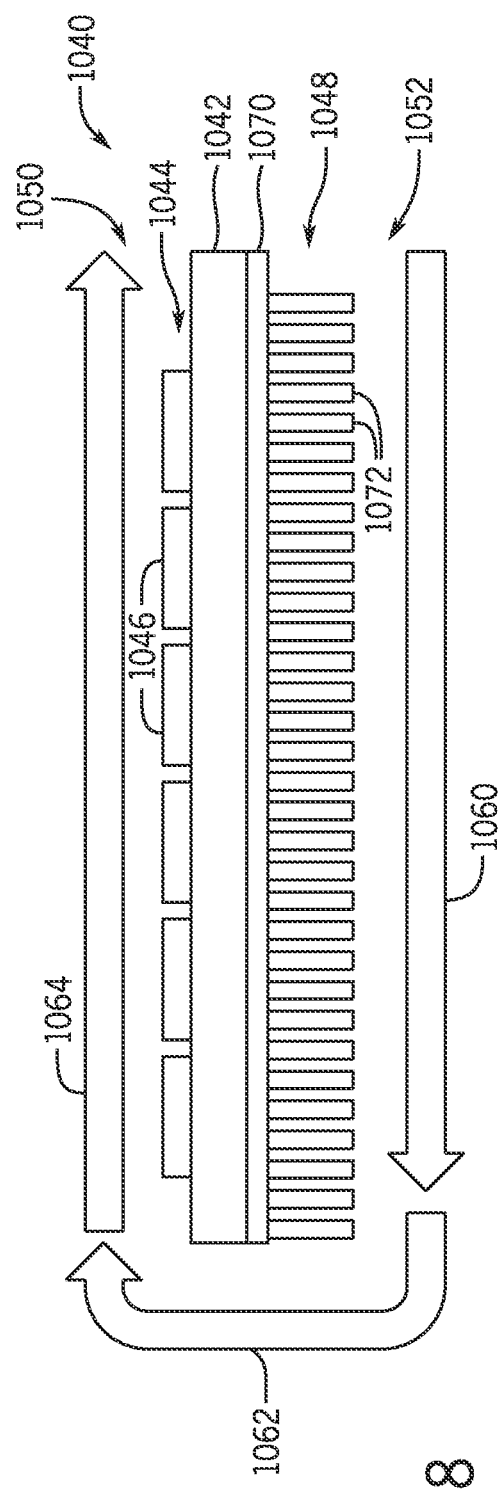

LIGHT EMITTING DIODE COOLING WITH TURBULENT FLOW

CROSS-REFERENCE TO RELATED APPLICATION

This application claims priority from and the benefit of U.S. Provisional Patent Application Ser. No. 63/178,344, entitled "LIGHT EMITTING DIODE COOLING WITH TURBULENT FLOW", filed Apr. 22, 2021, which is hereby incorporated by reference.

BACKGROUND

The present disclosure relates generally to light cooling systems.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, LED lighting instruments provide lighting for a variety of applications. In some applications, high intensity lighting from LED lighting instruments may be desirable. For example, LED lighting instruments may provide high intensity lighting for motion picture and television sets and studios. To provide such high intensity lighting (e.g., lighting consuming 500 W-1500 W or greater, traditional HMI lights can be up to 18,000 Watts of total power), an arrangement of LEDs within the lighting instruments may be relatively dense and numerous. As the density of LEDs in a given space increase, an amount of heat produced by the LEDs and a temperature of the LEDs may generally increase. Typical Wall Plug Efficiency ("WPE") of blue LEDs used to make white light is 50% such that only 50% of the energy will be converted into photons and the other 50% will be lost as heat. There may be an additional loss when the light is converted from blue light to white by the phosphors. As such, about half of the electrical power provided to LEDs is converted into heat.

Conventional cooling techniques for lighting systems may not sufficiently cool such high intensity LED lighting instruments. Additionally, Chip Scale Packaging ("CSP") technology and Chip on Board ("COB") arrays provide the ability to directly attach LED die to a printed circuit board ("PCB") without a package. Typical LED die are only 1 mm in size (e.g., a length of the die) or less. The LED die are packaged separately, which makes them easier to handle in manufacturing and increases the available area for dissipating heat (e.g., 3 mm×3 mm is a common package for example). In COB and/or CSP technology, an array of LED dies is attached directly to a high-resolution PCB which can dramatically increase the power density. LED arrays with power densities of 80 watts per square inch and higher are produced today, and these CSP and COB technologies with higher power densities are constantly being developed. LEDs may typically require a junction temperature of less than 125 degrees Celsius, or they may deteriorate. Due to the heat restrictions, the packing density of LEDs in system designs is effectively limited by heat. Traditional air-cooling techniques, such as via heat sinks, may not sufficiently cool the LED lighting instruments. Even adding fans to increase airflow over metal heat sinks provides limited heat dissipation. Although the following description describes cooling systems used in LED lighting systems, the cooling systems may be deployed in other lighting systems.

BRIEF DESCRIPTION

In certain embodiments, cooling system for a light emitting diode ("LED") assembly includes a fluid configured to absorb heat at the LED assembly, a heat exchanger coupled to one or more substrates of the LED assembly, where the heat exchanger is configured to exchange heat between the LED assembly and the fluid, and a pump configured to circulate the fluid along the LED assembly and the heat exchanger, where the fluid exhibits a turbulent flow at the LED assembly, the heat exchanger, or both, while circulated by the pump.

BRIEF DESCRIPTION OF DRAWINGS

These and other features, aspects, and advantages of the present disclosure will become better understood when the following detailed description is read with reference to the accompanying drawings in which like characters represent like parts throughout the drawings. The patent or application file contains at least one drawing executed in color. Copies of this patent or patent application publication with color drawing(s) will be provided by the Office upon request and payment of the necessary fee.

FIG. 17 is a cross-sectional view of an embodiment of an LED assembly immersed in a coolant within a flow path for cooling, in accordance with one or more current embodiments;

FIG. 18 is a cross-sectional view of an embodiment of an LED assembly including an LED array coupled to a heat exchanger, where the LED array and the heat exchanger are immersed in a coolant within a flow path for cooling, in accordance with one or more current embodiments;

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers'specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
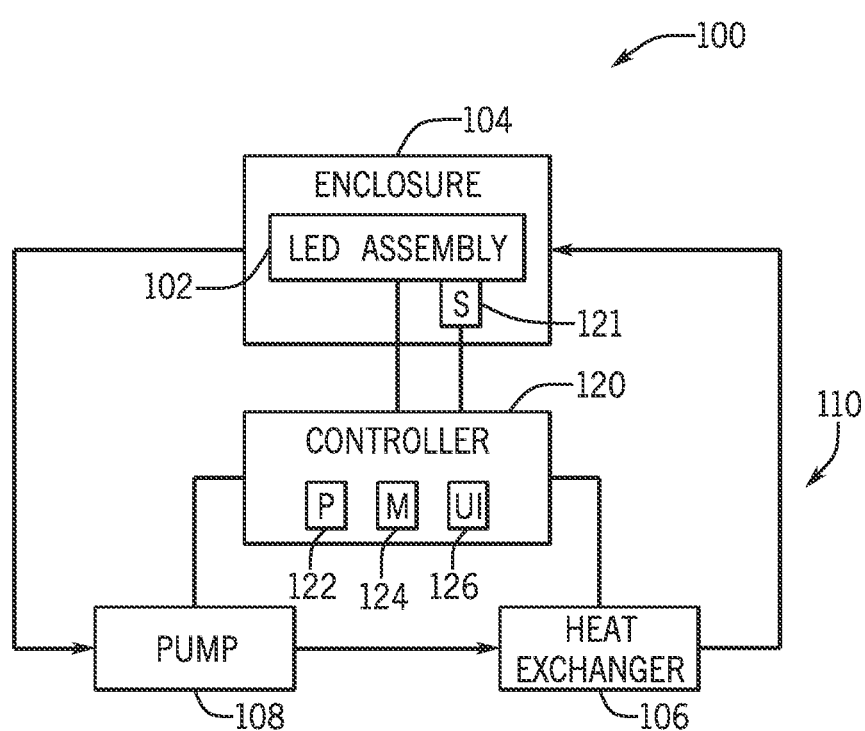
FIG. 1 is a schematic diagram of an embodiment of a cooling system configured to immersively and actively cool a light emitting diode (LED) assembly, in accordance with one or more current embodiments.

Turning now to the drawings, FIG. 1 is a schematic diagram of a cooling system 100 configured to actively cool an LED assembly 102 (e.g., LED device). The cooling system 100 includes an enclosure 104 configured to at least partially enclose and/or house the LED assembly 102 and a heat exchanger 106 fluidly coupled to the enclosure 104. The cooling system 100 also includes a pump 108 configured to circulate fluid (e.g., coolant, mineral oil, water, a hydrocarbon fluid, a silicon fluid, or a combination thereof) along a cooling circuit 110 through the heat exchanger 106, through the enclosure 104, through and/or over the LED assembly 102, and back to the pump 108. In certain embodiments, the cooling system 100 may include the LED assembly 102 or a portion thereof.

The LED assembly 102 may be any assembly including one or more LEDs. For example, to provide lighting for applications such as television and theater sets, film sets, tradeshows, and any one of the range of permanent, semi-permanent, and temporary settings, the LED assembly 102 may include multiple LEDs configured to emit light. While emitting light, the LEDs may produce heat and a temperature of a surrounding area (e.g., an area adjacent to the LED assembly 102 and/or within/adjacent to the enclosure 104) may generally increase.

During operation, the cooling system 100 is configured to absorb the heat generated by the LED assembly 102 and to transfer the heat to ambient air. For example, as the pump 108 circulates the fluid through the enclosure 104 and/or through the LED assembly 102, the fluid may absorb the heat generated by the LED assembly 102. The heat exchanger 106 may include a radiator and/or fan(s) configured to actively draw ambient air toward/across the heat exchanger 106 to cool the fluid traveling through the heat exchanger 106 and along the cooling circuit 110. In certain embodiments, the heat exchanger 106 may include a second fluid (e.g., in addition to or in place of the ambient air) configured to exchange heat with the fluid flowing along the cooling circuit 110.

The pump 108 may be a variable speed pump configured to circulate the fluid through the cooling circuit 110. In certain embodiments, a housing of the pump 108 may include a flexible diaphragm configured to expand and/or retract based on a volume of the fluid flowing along the cooling circuit 110. For example, as the fluid absorbs heat at and from the LED assembly 102, the fluid may expand (e.g., thermal expansion). As the fluid flows from the LED assembly 102 and the enclosure 104, the flexible diaphragm of the pump 108 may expand to allow of the increased volume of fluid to pass through the pump without affecting the flowrate of the fluid through the pump 108 and along the cooling circuit 110. In some embodiments, the flexible diaphragm of the pump 108 may be a service panel configured to allow access to internal portions of the pump 108. As described in greater detail below, in certain embodiments, the flexible diaphragm may be located elsewhere along the cooling circuit 110 (e.g., in addition to or in place of be located at the pump 108) to facilitate thermal expansion of the fluid in the cooling circuit 110.

The LED assembly 102 is configured to emit light, which may pass through the fluid circulating between the LED assembly 102 and the enclosure 104 and through the enclosure 104. As such, the LED assembly 102 is configured to provide lighting for the various applications described herein (e.g., motion picture and television lighting and other applications that may benefit from high intensity lighting) while being cooled by the cooling system 100. The LEDs of the LED assembly 102 may include varied/multiple configurations. For example, the LED assembly 102 may include chip scale packaging (CSP) arrays (e.g., bi-color CSP arrays). CSP technology may benefit from very high density of LED chips in a specified area (e.g., per square inch/centimeter), and CSP technology may utilize different colors of individual LEDs. For example, CSP technology may include a five color configuration (e.g., warm white, cool white, red, green, and blue), a four color configuration (e.g., white, red, green, and blue), a three color configuration (e.g., red, green, and blue), a bi-color white configuration (e.g., warm white and cool white), a single white configuration, and/or a single color configuration.

In some embodiments, the LED assembly 102 may include single color chip on board ("COB") arrays. The COB arrays may include a relatively large number of LEDs bonded to a single substrate and a layer of phosphor placed over the entire array. An advantage of COB technology is very high LED density per specified area (e.g., per square inch/centimeter). Additionally or alternatively, the LED assembly 102 may include discrete LEDs.

The cooling system 100 includes a controller 120 configured to control the LED assembly 102, the heat exchanger 106, the pump 108, or a combination thereof. For example, the controller 120 may control some or all LEDs of the LED assembly 102 to cause the LEDs to emit light. Additionally or alternatively, the controller 120 may control operation of the heat exchanger 106 to cause the heat exchanger 106 to exchange more or less heat between the fluid and the ambient air. For example, the controller 120 may control fans of the heat exchanger 106 to control an air flow rate through/over the heat exchanger 106. In certain embodiments, the fans of the heat exchanger 106 may be controlled via pulse width modulated (PWM) power. The fans may be controlled based on the temperature at the LED assembly 102. In some embodiments, to reduce a noise output of the fans of the heat exchanger 106, the controller 120 may operate the fans only when cooling of the fluid by other means (e.g., via the radiator without active airflow) is insufficient.

As illustrated, the cooling system 100 may include a sensor 121 disposed at the LED assembly 102 and configured to output a signal (e.g., an input signal) indicative of the temperature at the LED assembly 102 and/or a temperature of the fluid adjacent to the LED assembly 102. The sensor 121 may be any suitable temperature/thermal sensor, such as a thermocouple. In certain embodiments, the cooling system 100 may include other thermal sensor(s) disposed within the fluid and configured to output a signal indicative of a temperature of the fluid (e.g., within the enclosure 104) and/or disposed at the enclosure 104 and configured to output a signal indicative of a temperature at the enclosure 104.

Further, the controller 120 may control operation of the pump 108 to cause the pump 108 to circulate the fluid along the cooling circuit 110 at particular flowrates. For example, based on the temperature at the LED assembly 102 and/or at the enclosure 104 (e.g., based on the signal indicative of the temperature at the LED assembly 102 received from the sensor 121), the controller 120 may be configured to output a signal (e.g., an output signal) to the pump 108 indicative of instructions to adjust the flowrate of the fluid flowing through the cooling circuit 110.

As illustrated, the controller 120 includes a processor 122 and a memory 124. The processor 122 (e.g., a microprocessor) may be used to execute software, such as software stored in the memory 124 for controlling the cooling system 100 (e.g., for controller operation of the pump 108 to control the flowrate of fluid through the cooling circuit 110). Moreover, the processor 122 may include multiple microprocessors, one or more "general-purpose" microprocessors, one or more special-purpose microprocessors, and/or one or more application specific integrated circuits (ASICS), or some combination thereof. For example, the processor 122 may include one or more reduced instruction set (RISC) or complex instruction set (CISC) processors.

The memory device 124 may include a volatile memory, such as random-access memory (RAM), and/or a nonvolatile memory, such as read-only memory (ROM). The memory device 124 may store a variety of information and may be used for various purposes. For example, the memory device 124 may store processor-executable instructions (e.g., firmware or software) for the processor 122 to execute, such as instructions for controlling the cooling system 100. In certain embodiments, the controller 120 may also include one or more storage devices and/or other suitable components. The storage device(s) (e.g., nonvolatile storage) may include ROM, flash memory, a hard drive, or any other suitable optical, magnetic, or solid-state storage medium, or a combination thereof. The storage device(s) may store data (e.g., measured temperatures at the LED assembly 102), instructions (e.g., software or firmware for controlling the cooling system 100), and any other suitable data. The processor 122 and/or the memory device 124, and/or an additional processor and/or memory device, may be located in any suitable portion of the system. For example, a memory device for storing instructions (e.g., software or firmware for controlling portions of the cooling system 100) may be located in or associated with the cooling system 100.

Additionally, the controller 120 includes a user interface 126 configured to inform an operator of the temperature at the LED assembly 102 and/or of the flowrate of the fluid through the cooling circuit 110. For example, the user interface 126 may include a display and/or other user interaction devices (e.g., buttons) configured to enable operator interactions.

Figure 2:
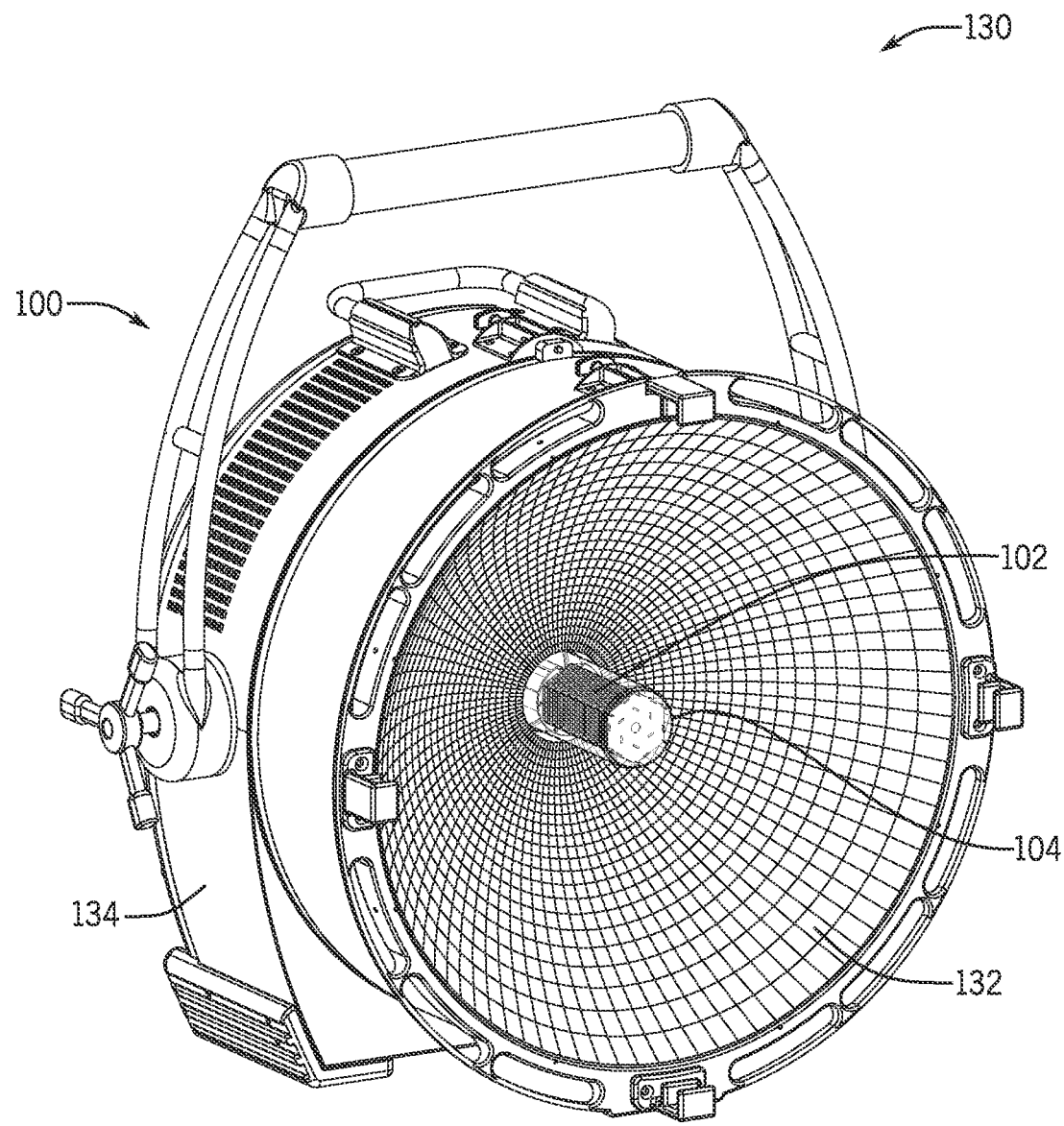
FIG. 2 is a perspective view of an embodiment of a lighting assembly having the LED assembly and the cooling system of FIG. 1, in accordance with one or more current embodiments.

FIG. 2 is a perspective view of an embodiment of a lighting assembly 130 having the cooling system 100 and the LED assembly 102 of FIG. 1. The lighting assembly 130 includes a reflector 132 (e.g., a parabolic reflector) configured to reflect light emitted by the LED assembly 102. For example, the light emitted by the LED assembly 102 may pass through the fluid disposed between the LED assembly 102 and the enclosure 104, through the enclosure 104, and may be reflected by the reflector 132 outwardly. The reflector 132 is coupled to a chassis 134 (e.g., a housing) of the lighting assembly 130. In certain embodiments, the LED assembly 102, the enclosure 104, and/or other portions of the cooling system 100 may be coupled to the chassis 134. For example, as described in greater detail below, the heat exchanger 106 and/or the pump 108 of the cooling system 100 may be coupled to the chassis 134.

Figure 3:
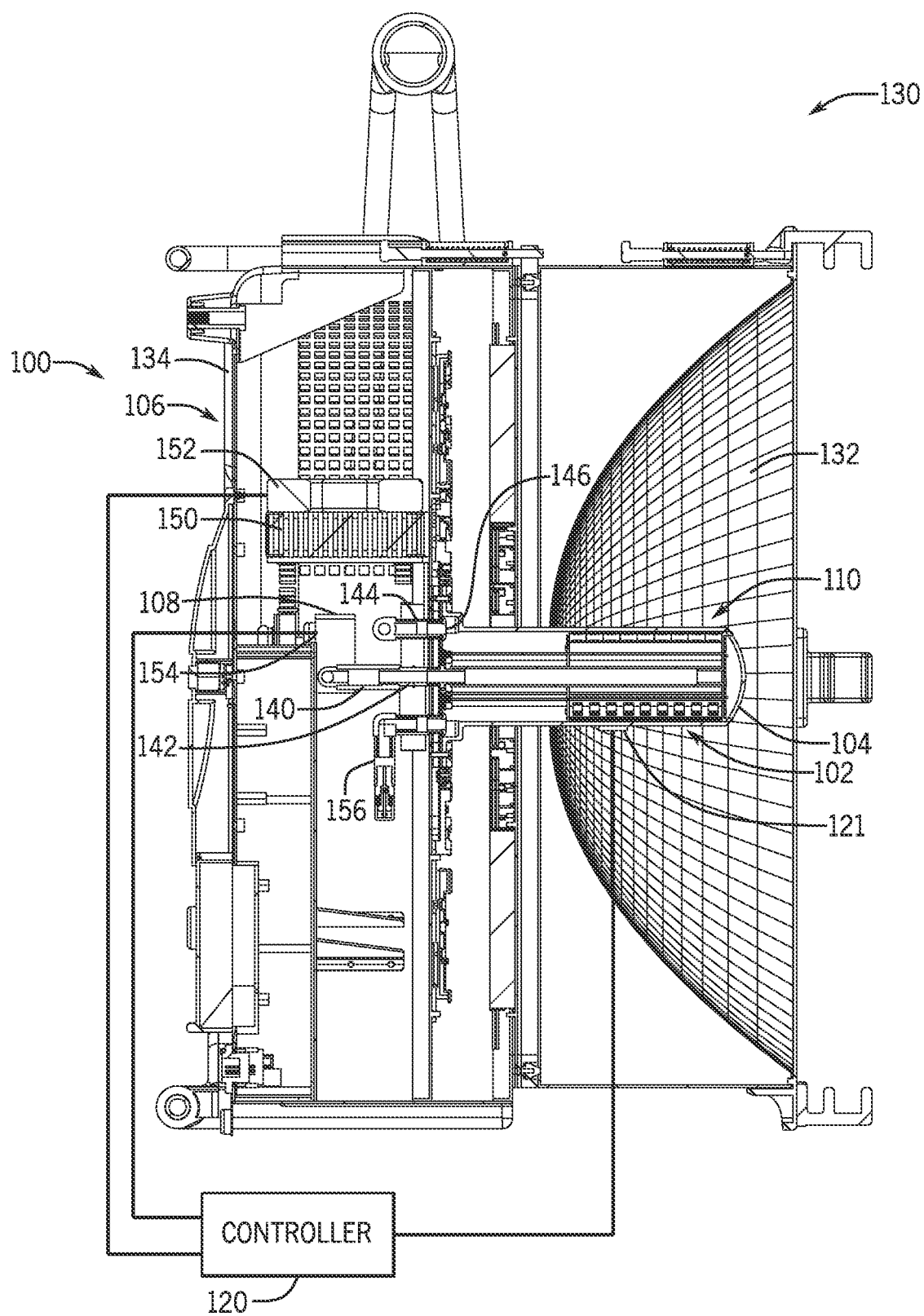
FIG. 3 is a cross-sectional view of the lighting assembly of FIG. 2 having the cooling system and the LED assembly, in accordance with one or more current embodiments.

FIG. 3 is a cross-sectional view of the lighting assembly 130 of FIG. 2 having the cooling system 100. As illustrated, the cooling system 100 includes the enclosure 104, the LED assembly 102 disposed in the enclosure 104, the heat exchanger 106 configured to exchange heat with the fluid, and the pump 108 configured to drive circulation of the fluid. Additionally, the cooling system 100 includes an inlet pipe 140 coupled to the pump 108 and to a fluid inlet 142 of the enclosure 104. Further, the cooling system 100 includes an outlet pipe 144 coupled to a fluid outlet 146 of the enclosure 104 and to the heat exchanger 106. In certain embodiments, the inlet pipe 140 and/or the outlet pipe 144 may extend into the LED assembly 102 and/or into the enclosure 104.

As illustrated, the fluid inlet 142 is disposed generally along a centerline of the enclosure 104 and the LED assembly 102. The pump 108 is configured to drive the fluid from the inlet pipe 140, into the fluid inlet 142, generally along the centerline of the LED assembly 102 and the enclosure 104, into and along a gap between the LED assembly 102 and the enclosure (e.g., a gap where the fluid absorbs heat generated by the LED assembly 102), out of the fluid outlet 146, and into the outlet pipe 144 (e.g., along the cooling circuit 110). After absorbing heat at the LED assembly 102, the fluid circulates through the heat exchanger 106 and returns to the pump 108. At the heat exchanger 106, the fluid rejects the heat absorbed at the LED assembly 102. For example, the heat exchanger 106 includes a radiator 150 and fans 152 configured to draw air (e.g., ambient air) across the radiator 150. The air drawn across the radiator 150 may absorb heat from the fluid flowing through the radiator 150 (e.g., heat transferred from the fluid to the radiator 150), thereby cooling the fluid for subsequent circulation along the cooling circuit 110 and back through the LED assembly 102 and the enclosure 104.

Additionally, in certain embodiments, the heat exchanger 106 may not reject all the heat absorbed by the fluid at the LED assembly 102, such that the fluid retains at least some of the heat absorbed at the LED assembly 102. As such, a temperature of the fluid along the cooling circuit 110 (e.g., an average temperature) may increase, thereby increasing a volume of the fluid. The cooling system 100 includes a flexible membrane 154 at the pump 108 configured to expand due to heating of the fluid and to retract due to cooling of the fluid (e.g., to accommodate volumetric changes of the fluid along the cooling circuit 110). In certain embodiments, the flexible membrane 154 may be included elsewhere within the cooling system 100.

The cooling system 100 includes a valve 156 fluidly coupled to the cooling circuit 110. The valve 156 may be configured to bleed air and/or fluid from the cooling circuit 110, such as when fluid is added to the cooling circuit 110 (e.g., the valve 156 may be a bleed valve). Additionally or alternatively, fluid may be added to the cooling circuit 110 via the valve 156 (e.g., the valve 156 may be a fill valve). In certain embodiments, the cooling system 100 may include multiple valves 156 with a first valve 156 being a bleed valve and a second valve 156 being a fill valve.

As described above, the controller 120 may be configured to control the LED assembly 102, the heat exchanger 106, the pump 108, or a combination thereof. For example, the controller 120 may control some or all LEDs of the LED assembly 102 to cause the LEDs to emit light. Additionally, the controller 120 may control a rotation rate of the fans 152 and/or a flow rate of the fluid along the cooling circuit 110. For example, based on feedback received from the sensor 121 at the LED assembly 102 (e.g., the temperature at the LED assembly 102, the controller 120 may control the rotation rate of the fans 152 and/or the flow rate of the fluid. More specifically, in response the temperature at the LED assembly 102 being greater than a target temperature and a difference between the temperature at the LED assembly 102 and the target temperature exceeding a threshold value, the controller may increase the rotation rate of the fans 152 and/or may increase the flow rate of the fluid. In response the temperature at the LED assembly 102 being less than the target temperature and the difference between the temperature at the LED assembly 102 and the target temperature exceeding a threshold value, the controller may decrease the rotation rate of the fans 152 and/or may decrease the flow rate of the fluid.

Figure 4:
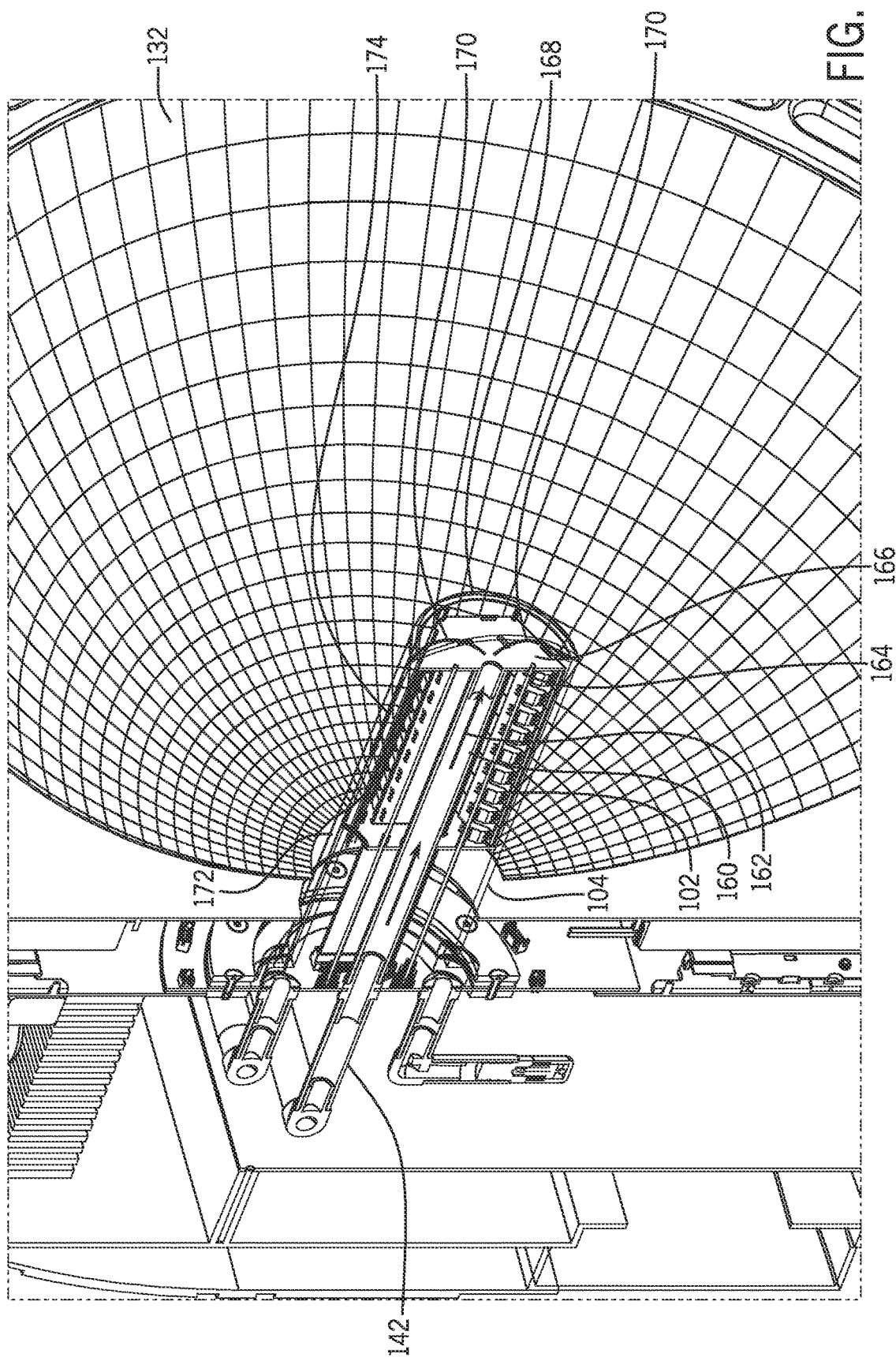
FIG. 4 is a perspective cross-sectional view of the lighting assembly of FIG. 2 having the cooling system and the LED assembly, in accordance with one or more current embodiments.

FIG. 4 is a perspective cross-sectional view of the lighting assembly 130 of FIG. 2 having the cooling system 100. As illustrated, the fluid of the cooling system 100 is configured to flow from the inlet pipe 140, through the fluid inlet 142, and through an inner annular passage 160 formed within the LED assembly 102 (e.g., in a direction 162). As such, the fluid enters the LED assembly 102 as a chilled fluid. The inner annular passage 160 is coupled to the fluid inlet 142 and to an end 164 of the LED assembly 102. From the inner annular passage 160, the fluid circulates through an end passage 166 formed between the end 164 of the LED assembly 102 and an end 168 of the enclosure 104, as indicated by arrows 170. From the end passage 166, the fluid circulates into an outer annular passage 172 formed between the LED assembly 102 and the enclosure 104, as indicated by arrow 174. As the fluid flows through the outer annular passage 172, the fluid absorbs heat generated by the LED assembly 102. From the outer annular passage 172, the fluid exits the enclosure 104 through the fluid outlet 146 and flows into the outlet pipe 144. As such, the fluid exits the enclosure 104 as a heated fluid. After passing through the heat exchanger 106 and the pump 108 of the cooling system 100, the fluid circulates back to through the LED assembly 102 and the enclosure 104 to continue cooling the LED assembly 102.

The lighting assembly 130 is a side emission configuration of the lighting assembly, such that the lighting assembly 130 is configured to emit light radially outwardly (e.g., from sides of the lighting assembly 130) and through the fluid and the enclosure 104. As described in greater detail below in reference to FIGS. 14 and 15, the cooling system 100 may include a front emission configuration of the lighting assembly, such as in place of or in addition to the side emission configuration of FIGS. 2-5.

Figure 5:
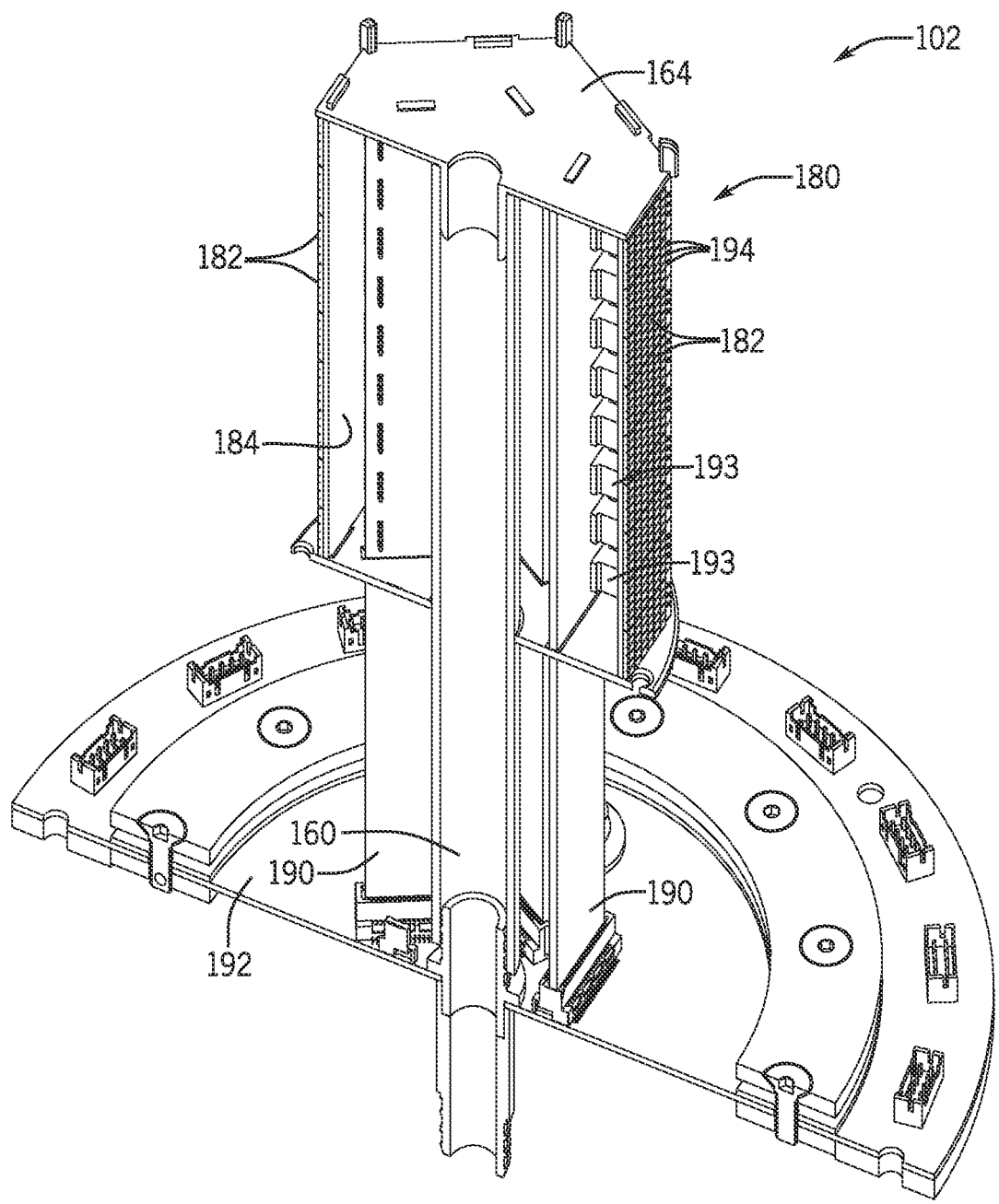
FIG. 5 is a perspective view of the LED assembly of FIG. 2, in accordance with one or more current embodiments.

FIG. 5 is a perspective view of the LED assembly 102 of FIG. 2. As illustrated, the LED assembly 102 includes a tower 180 and LED arrays 182 mounted to the tower 180. As illustrated, the tower 180 is a hexagonal structure formed by panels 184 (e.g., six panels 184) with nine LED arrays 182 mounted on each panel 184. In certain embodiments, the tower may include more or fewer panels 184 (e.g., three panels 184, four panels 184, eight panels 184, etc.) and/or each panel 184 may include more or fewer LED arrays 182 (e.g., one LED array 182, two LED arrays 182, five LED arrays 182, twenty LED arrays 182, etc.). In some embodiments, the tower 180 may be shaped differently in other embodiments and/or may be omitted. For example, the LED arrays 182 may be mounted directly to the enclosure 104 in some embodiments. In certain embodiments, the LED assembly 102 may include other LED configurations in addition to or in place of the LED arrays 182.

The LED arrays 182 of the LED assembly 102 are configured to emit light outwardly through the fluid flowing between the LED assembly 102 and the enclosure 104 (e.g., through the outer annular passage 172 formed between the LED assembly 102 and the enclosure 104) and through the enclosure 104. The fluid may be transparent or semi-transparent such that the fluid is configured to allow the light to pass through the fluid toward the enclosure 104. For example, the fluid may be a dielectric and/or electrically insulating fluid having a refractive index of between 1.4 and 1.6. In some embodiments, the enclosure 104 enclosing the fluid may be acrylic, polycarbonate, glass (e.g., borosilicate glass), or another material having a refractive index between about 1.44-1.5. In certain embodiments, the LEDs of the LED arrays 182 may include silicone (e.g., a silicone layer) through which light emitted by the LEDs passes. The silicone may have a refractive index of about 1.38-1.6. As such, a type of fluid (e.g., the fluids having the refractive indices recited above) may facilitate light passage from the LEDs, through the fluid, and toward the enclosure 104. Additionally, the refractive index of the layer of the LED (e.g., the silicone), the fluid, and/or the enclosure 104 may generally be matched (e.g., within a difference threshold). In some embodiments, the fluid and/or the enclosure 104 may behave as lens configured to optically shape light provided by the LED assembly 102. For example, the fluid and/or the enclosure 104 having the specific refractive indices described above may allow the fluid and/or the enclosure to shape the light in a desirable manner.

Additionally or alternatively, the fluid may include a mineral oil having a relatively long shelf life (e.g., about twenty-five years) or a fluid having properties similar to mineral oil. The fluids may be non-corrosive such that the fluids facilitate pumping along the cooling circuit 110 by the pump 108 and compatible with plastics and other system materials. Further, such fluids may generally have a relatively low viscosity, which may allow directly cooling the electronics of the LED assembly 102 (e.g., the LED arrays 182, wiring coupled to the LED arrays 182 and to printed circuit boards ("PCB's"), and other electronic components of the LED assembly 102) without affecting the performance/functionality of the electronics. In certain embodiments, the type of the fluid included in the cooling circuit 110 may depend on an amount of LED arrays 182 and/or a number of LEDs generally included in the LED assembly 102, a structure/geometry of the LED assembly 102, a density of LEDs of the LED assembly 102, an amount of heat generated by the LED assembly 102, or a combination thereof. During operation, the LED arrays 182 of the LED assembly 102 may have a power density of between 20 W-300 W per square inch, between 50 W-250 W per square inch, and other suitable power densities. In an aspect, each LED array 182 may have a surface area of 4 square inches or less. Due to the cooling systems mentioned herein, the LED arrays 182 may be operated at the aforementioned power densities for longer than 30 seconds, 1 minute, 1 hour, and 100 hours. In some embodiments, the LED assembly 102 may have a total power of 400 W-5000 W.

In some embodiments, the refractive index of the fluid disposed between the LED arrays 182 and the enclosure 104 may cause light to more easily leave the LED arrays 182 compared to an embodiment in which the LED arrays 182 are exposed to air. This may result in a color shift of the light emitted from the LED arrays 182. The controller 120 may control the LED arrays 182 (e.g., the colors and/or color temperatures of the LED arrays 182) based on the potential color shift of the emitted light.

The enclosure 104 may include clear, transparent, and/or semi-transparent materials such that the light emitted by the LED assembly 102 may pass through the enclosure 104 (e.g., after passing through the fluid disposed within and/or flowing through the outer annular passage 172) and outwardly from the enclosure 104. For example, the enclosure 104 may be formed of a clear plastic and/or glass (e.g., borosilicate glass). In certain embodiments, the enclosure 104 may include poly(methyl methacrylate) ("PMMA") and/or other acrylics.

As illustrated, the LED assembly 102 includes printed circuit boards ("PCBs") 190 coupled to a base PCB 192, the LED arrays 182, and the end 164 (e.g., end plate) of the LED assembly 102. For example, each PCB 190 extends generally along a respective panel 184 and is coupled (e.g., physically and electrically coupled via connectors 193) to the LED arrays 182 coupled to the respective panel 184. Each connector 193 is coupled to a respective LED array 182 at connections 194. In certain embodiments, each LED array 182 may be configured to snap/click into place on the panel 184. For example, each panel 184 may include features configured to receive the LED arrays 182 via a snap or click mechanism to facilitate assembly of the LED assembly 102.

Figure 6A:
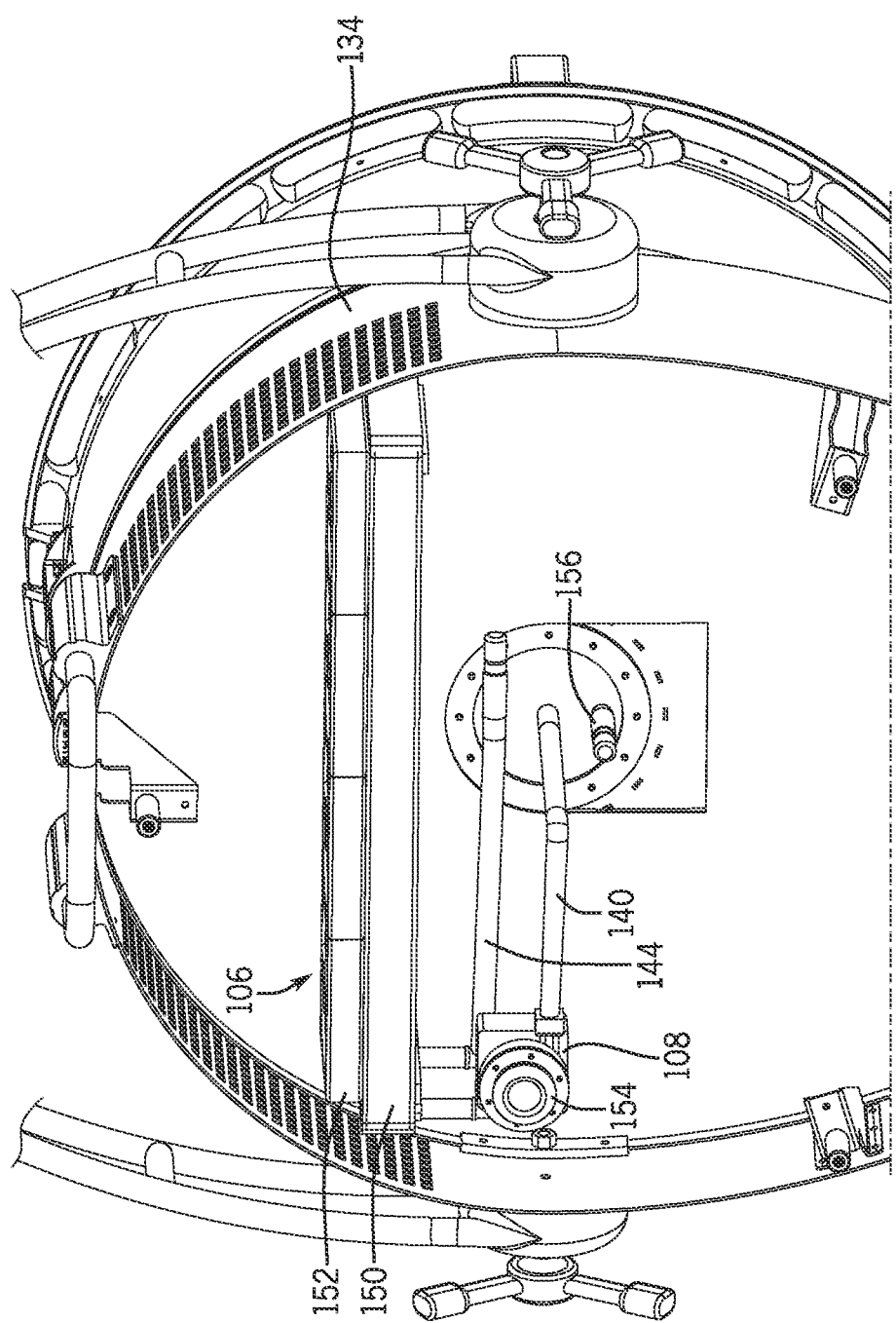
FIG. 6A is a rear perspective view of the lighting assembly of FIG. 2 having the cooling system and the LED assembly, in accordance with one or more current embodiments.

FIG. 6A is a rear perspective view of the lighting assembly 130 of FIG. 2 having the cooling system 100. As generally described above, the cooling system 100 includes the inlet pipe 140 configured to flow fluid (e.g., chilled fluid) into the LED assembly 102 and the enclosure 104 and the outlet pipe 144 configured to receive fluid (e.g., heated fluid) from the LED assembly 102 and the enclosure 104. The fluid circulates from the outlet pipe 144, through the radiator 150 of the heat exchanger 106, through the pump 108, and back to the inlet pipe 140. As illustrated, the cooling system includes four fans 152 configured to draw air across the radiator 150 to cool the fluid passing through the radiator 150. In certain embodiments, the cooling system may include more or fewer fans 152 (e.g., one fan 152, two fans 152, three fans 152, five fans 152, ten fans 152, etc.). The fans 152 are positioned above the radiator 150, such that the heat transferred from the fluid passing through the radiator 150 moves generally upwardly toward/through the fans 152. Additionally, the heat exchanger 106 and the pump 108 are mounted to the chassis 134 of the lighting assembly 130.

Figure 6B:
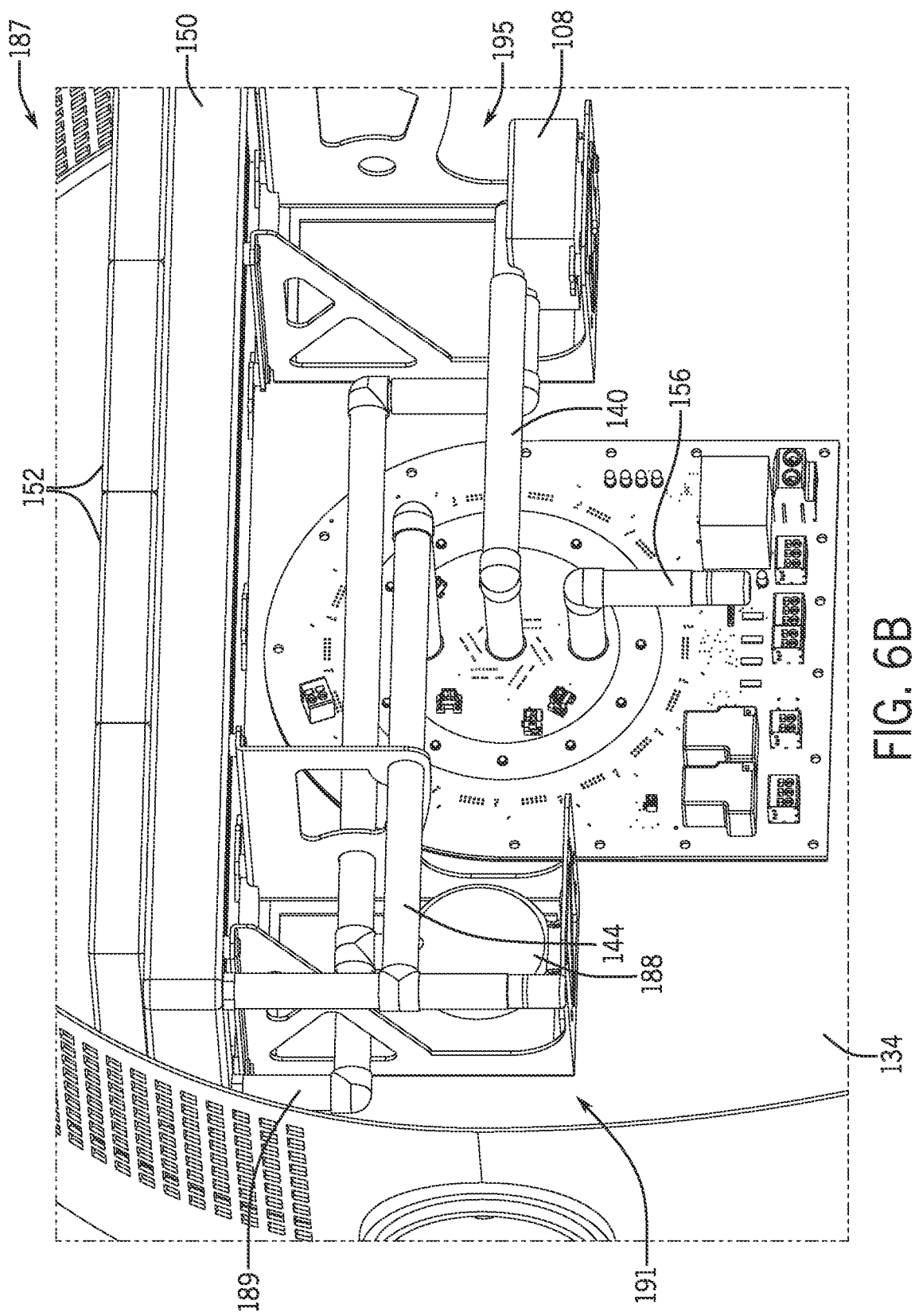
FIG. 6B is a rear perspective view of another embodiment of a lighting assembly having the cooling system of FIG. 1, in accordance with one or more current embodiments.

FIG. 6B is a rear perspective view of an embodiment of a lighting assembly 187 having the cooling system 100 of FIG. 1. The lighting assembly 187 includes the inlet pipe 140 configured to flow fluid (e.g., chilled fluid) into the LED assembly 102 and the enclosure 104 and the outlet pipe 144 configured to receive fluid (e.g., heated fluid) from the LED assembly 102 and the enclosure 104. The fluid circulates from the outlet pipe 144 to the radiator 150, through the radiator 150, to an intermediate pipe 189, through an expansion chamber 188 coupled to the intermediate pipe 189, and back to the inlet pipe 140 via the pump 108. The expansion chamber 188 is configured to expand due to heating of the fluid and to retract due to cooling of the fluid (e.g., to accommodate volumetric changes of the fluid along the cooling circuit 110). In certain embodiments, the expansion chamber 188 may be included elsewhere along the cooling circuit 110, such as along the inlet pipe 140 and/or along the outlet pipe 144.

As illustrated, the lighting assembly 187 includes a first bracket 191 coupled to the radiator 150 and the expansion chamber 188 and a second bracket 195 coupled to the radiator 150 and the pump 108. The radiator 150 and the expansion chamber 188 are mounted to the first bracket 191, and the first bracket 191 is mounted to the chassis 134, such that the first bracket 191 is configured to support a weight of the expansion chamber 188 and/or at least a portion of a weight of the radiator 150 (e.g., to transfer forces associated with the weight(s) to the chassis 134). Additionally, the radiator 150 and the pump 108 are mounted to the second bracket 195, and the second bracket 195 is mounted to the chassis 134, such that the second bracket 195 is configured to support a weight of the pump 108 and/or at least a portion of the weight of the radiator 150 (e.g., to transfer forces associated with the weight(s) to the chassis 134).

Figure 7:
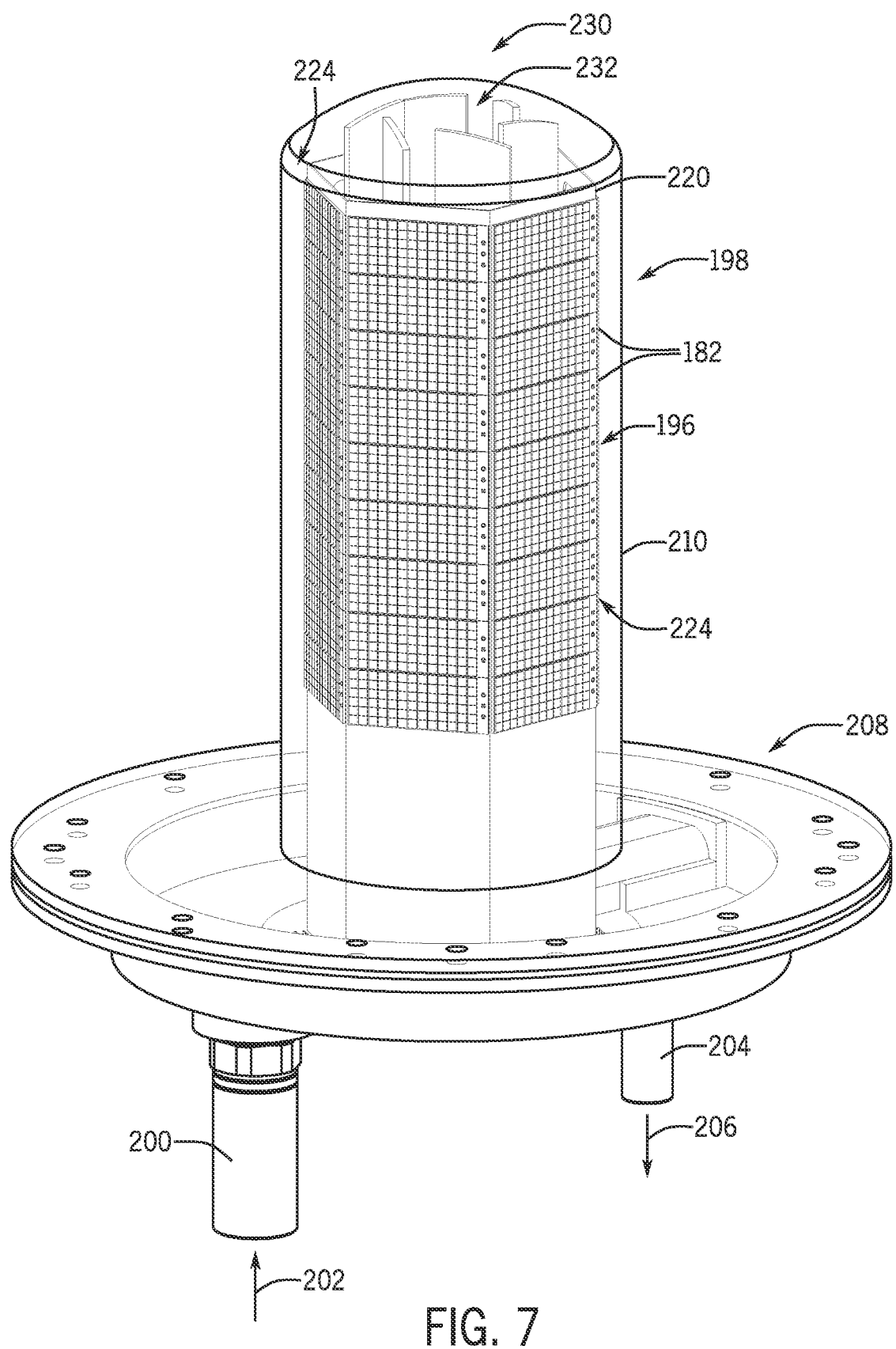
FIG. 7 is a perspective view of another embodiment of the cooling system and the LED assembly of FIG. 1 including a transparent enclosure, in accordance with one or more current embodiments.

FIG. 7 is a perspective view of an LED assembly 196 and an enclosure 198 that may be included the cooling system 100 of FIG. 1. As illustrated, the LED assembly 196 is disposed within the enclosure 198. The LED assembly 196 includes a fluid inlet 200 configured to receive the fluid flowing along the cooling circuit 110 (e.g., as indicated by arrow 202) and a fluid outlet 204 configured to flow the fluid from the enclosure and the LED assembly 196 to the cooling circuit 110 (e.g., as indicated by arrow 206) (although the fluid direction may be reversed such that the fluid enters through the fluid outlet 204, for example, and exits through the fluid inlet 200). Additionally, the enclosure 198 includes a base 208 and a cylinder 210 extending from the base 208. In certain embodiments, the LED assembly 196 and/or the enclosure 198 of the cooling system 100 may be included in the lighting assembly of FIGS. 2-6.

The LED assembly 196 includes a tower 220 and the LED arrays 182 mounted to the tower 220. As illustrated, the tower 220 is a hexagonal structure with nine LED arrays 182 mounted on each of the six sides of the hexagonal structure. In certain embodiments, the tower 220 may include more or fewer sides (e.g., three sides, four sides, eight sides, etc.) and/or each side may include more or fewer LED arrays 182 (e.g., one LED array 182, two LED arrays 182, five LED arrays 182, twenty LED arrays 182, etc.). In some embodiments, the tower 220 may be shaped differently in other embodiments and/or may be omitted. For example, the LED arrays 182 may be mounted directly to the enclosure 198 in some embodiments. In certain embodiments, the LED assembly 196 may include other LED configurations in addition to or in place of the LED arrays 182.

The LED arrays 182 of the LED assembly 196 are configured to emit light outwardly through the fluid flowing between the LED assembly 196 and the enclosure 198 (e.g., through an outer annular passage 224 of the cooling system 100) and through the enclosure 198. In some embodiments, the enclosure 198 enclosing the fluid may be acrylic, polycarbonate, glass (e.g., borosilicate glass), or another material having a refractive index between about 1.44-1.5. Additionally, the refractive index of the layer of the LED (e.g., the silicone), the fluid, and/or the enclosure 198 may generally be matched (e.g., within a difference threshold).

The enclosure 198 may include clear, transparent, and/or semi-transparent materials such that the light emitted by the LED assembly 196 may pass through the enclosure 198 (e.g., after passing through the fluid disposed within and/or flowing through the outer annular passage 224) and outwardly from the enclosure 198. For example, the enclosure 198 may be formed of a clear plastic and/or glass (e.g., borosilicate glass). In certain embodiments, the enclosure 198 may include poly(methyl methacrylate) ("PMMA") and/or other acrylics.

The cooling system 100 is configured to flow the fluid into the fluid inlet 200, through the outer annular passage 224 between the LED assembly 196 and the enclosure 198, and toward an end 230 of the tower 220. The end 230 is disposed generally opposite of the base 208. The tower 220 includes an inner annular passage 232 extending from the end 230 to the base 208. As illustrated, the inner annular passage 232 is fluidly coupled to the outer annular passage 224 at the end 230 of the tower 220. The cooling system 100 is configured to flow the fluid from the outer annular passage 224 and into the inner annular passage 232 via the end 230. The inner annular passage 232 is fluidly coupled to the fluid outlet 204 such that the fluid may pass through the tower 220, via the inner annular passage 232, and out of the tower 220 and the enclosure 198 at the fluid outlet 204.

As the fluid passes over and through the LED assembly 196 (e.g., over the LED arrays 182 and through the tower 220), the fluid is configured to absorb heat generated by operation of the LED arrays 182. For example, because the fluid is configured to absorb heat generated by the LED arrays 182 while flowing through both the outer annular passage 224 and the inner annular passage 232, the cooling system 100 is configured to significantly increase an amount of heat that may be absorbed compared to embodiments of cooling systems that extract heat only from an interior or exterior of a light source. Additionally, because the fluid is generally transparent and/or semi-transparent (e.g., the fluid has a refractive index generally between 1.4-1.5), the fluid may have minimal/no effects on the light emitted from the LED assembly 196 and through the fluid. As such, the fluid may actively cool the LED assembly 196 during operation of the LED assembly 196 with little to no effect on a quality of light emitted from the LED assembly 196.

The LED assembly 196 is a side emission configuration of a lighting assembly, such that the LED assembly 196 is configured to emit light radially outwardly (e.g., from sides of the LED assembly 196) and through the fluid and the enclosure 198. As described in greater detail below in reference to FIGS. 14 and 15, the cooling system 100 may also include a front emission configuration of the lighting assembly, such as in place of or in addition to the side emission configuration of FIGS. 7-10.

Figure 8:
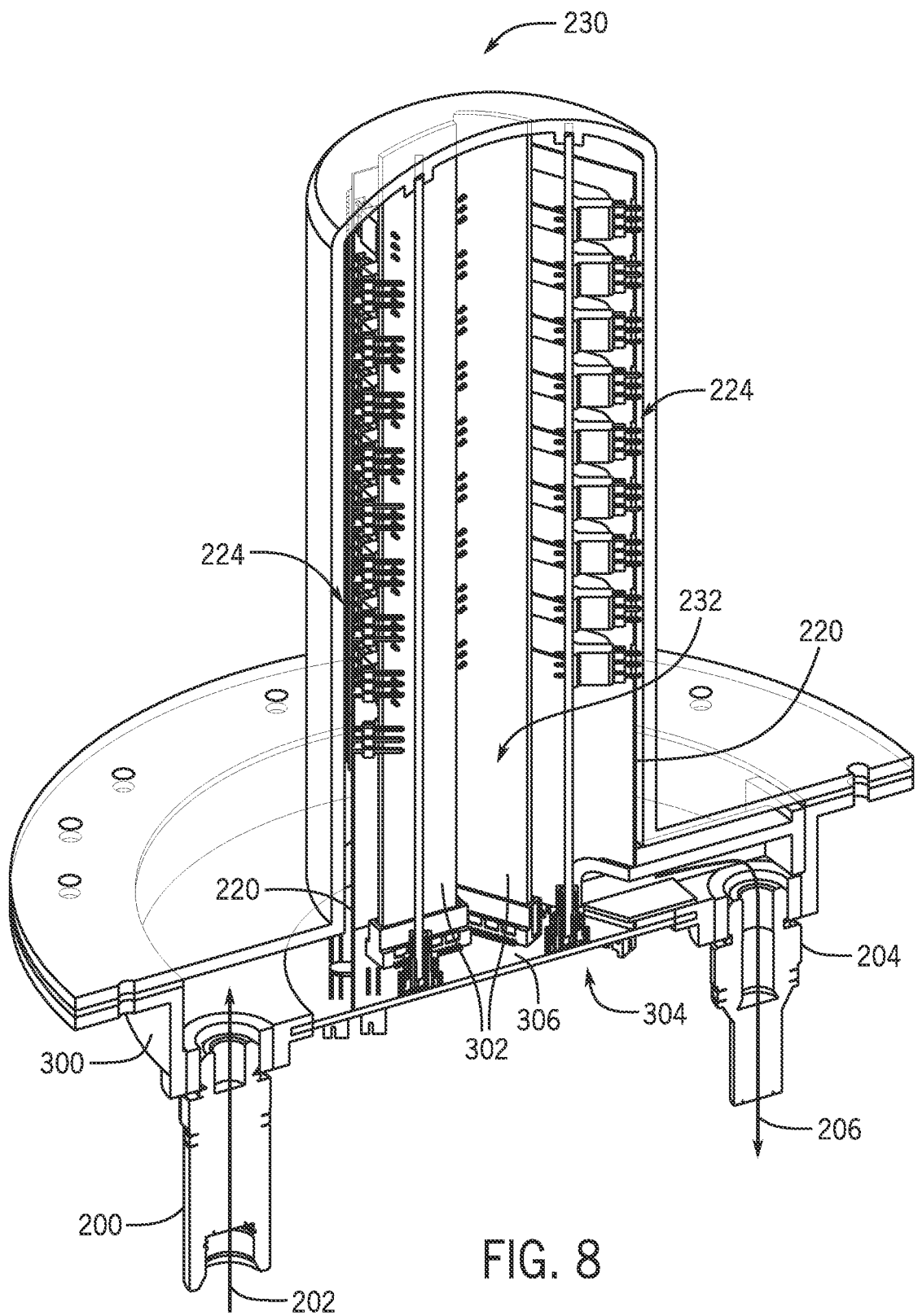
FIG. 8 is a perspective cross-sectional view of the LED assembly and the transparent enclosure of FIG. 7, in accordance with one or more current embodiments.

FIG. 8 is a perspective cross-sectional view of the LED assembly 196 and the enclosure 198 of FIG. 7. As described above, the enclosure 198 is configured to receive the fluid from the pump 108 through the fluid inlet 200. The fluid is then configured to contact the tower 220 and a base 300 of the LED assembly 196 coupled to the tower 220. The tower 220 and the base 300 are configured to direct the fluid upwardly along the outer annular passage 224. The fluid is then configured to flow through the end 230 and into the inner annular passage 232. As illustrated, the inner annular passage 232 is formed between and by the tower 220 and PCBs 302 of the LED assembly 196. The fluid is configured to flow downwardly within the inner annular passage 232 toward a base PCB 304 electrically coupled to the PCBs 302. After passing over the PCBs 302 and/or the base PCB 304, the fluid is configured to exit the tower 220 and the enclosure 198 at the fluid outlet 204. As mentioned with respect to FIG. 7, the fluid direction may be reversed such that the fluid may be configured to flow in through the fluid outlet 204, up through the inner annular passage 232, through the end 230, and down the outer annular passage 224, and out the fluid inlet 200.

The PCBs 302 may be electrically coupled to the LED arrays 182 such that the PCBs 302 may provide power and/or communication with the LED arrays 182. For example, the LED assembly 196 may include wiring extending outwardly between the PCBs 302 and the LED arrays 182. As such, the fluid may flow over the PCBs 302 and the wiring extending between the PCBs 302 and the LED arrays 182 to cool and absorb heat from the tower 220 (e.g., heat generated by the LED arrays 182 that is transferred to/absorbed by the tower 220), from the PCB s 302, and/or from the wiring. Additionally, the fluid may flow over the base PCB 304 and may absorb heat from the base PCB 304. For example, the base PCB 304 includes a wet side 306 configured to contact the fluid and a dry side generally opposite the wet side 306 that is configured to remain dry (e.g., to not contact the fluid). As generally described above, the fluid may be dielectric and/or electrically insulating such that the fluid may have minimal/no electrical effects on the LED arrays 182, the PCBs 302, the base PCB 304, and the wiring of the LED assembly 196.

Figure 9:
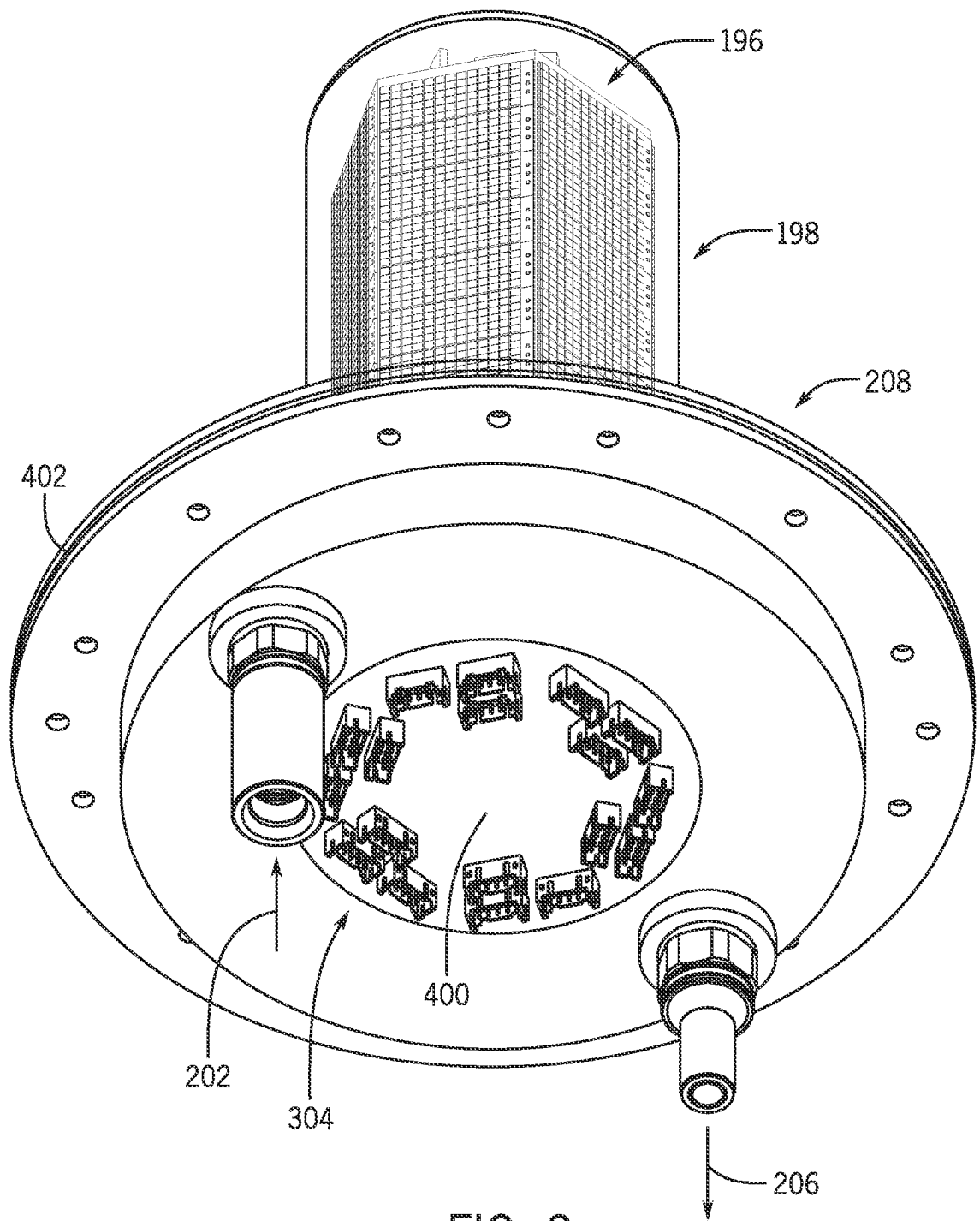
FIG. 9 is a bottom perspective view of the LED assembly and the transparent enclosure of FIG. 7, in accordance with one or more current embodiments.

FIG. 9 is a bottom perspective view of the LED assembly 196 and the enclosure 198 of FIG. 7. As illustrated, the base PCB 304 includes a dry side 400 configured to remain generally dry (e.g., to not contact the fluid during operation of the cooling system 100). The LED assembly 196 includes a gasket 402 configured to form a seal between the enclosure 198 and the LED assembly 196 (e.g., between the base 208 of the enclosure 198 and the base PCB 304 of the LED assembly 196). As such, the LED assembly 196 may be remain dry at the dry side 400 of the base PCB 304, and the cooling system 100 may be configured to flow the fluid through the enclosure 198 and the tower 220 without leaking fluid.

Figure 10:
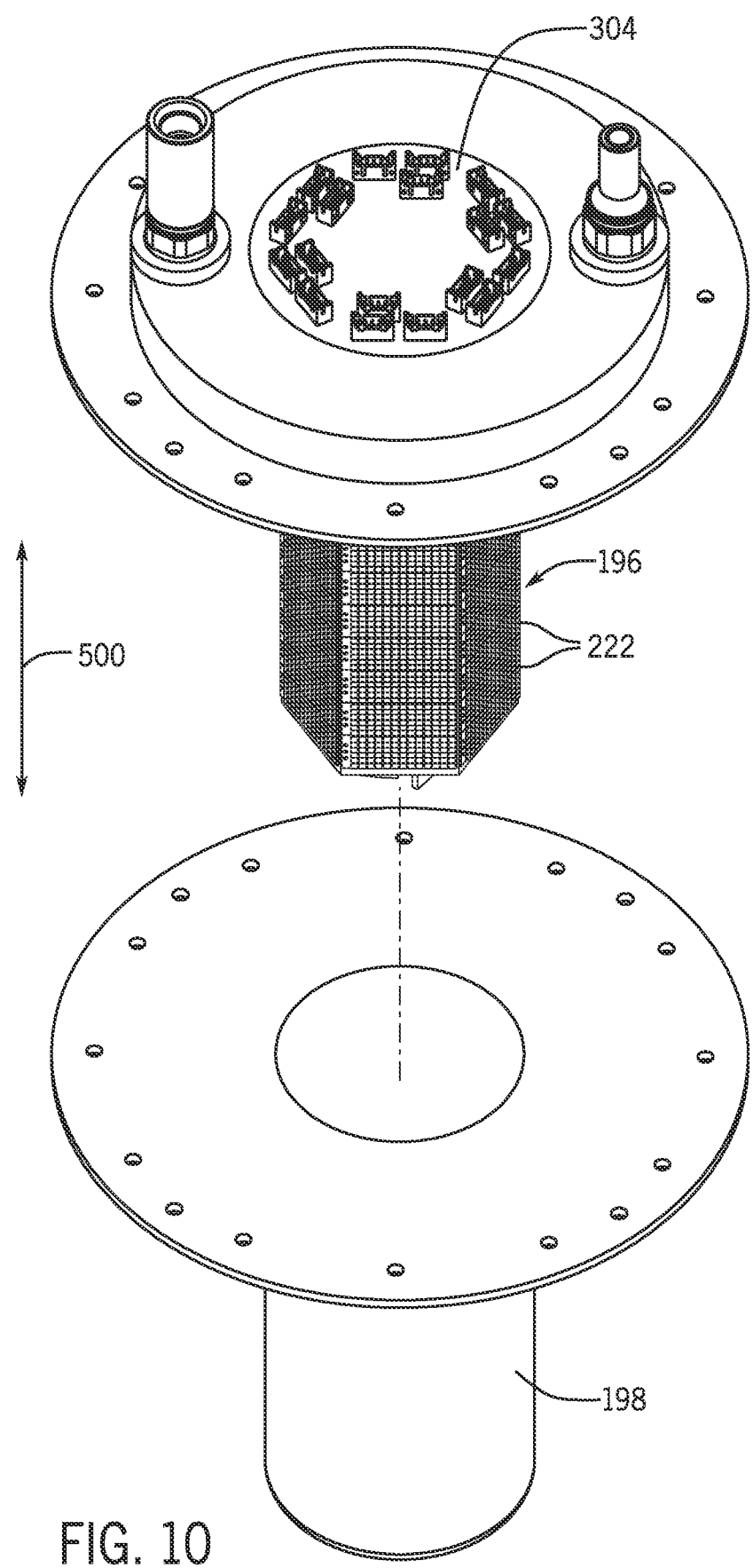
FIG. 10 is a partially exploded view of the LED assembly and the transparent enclosure of FIG. 7, in accordance with one or more current embodiments.

FIG. 10 is a partially exploded view of the LED assembly 196 and the enclosure 198 of FIG. 7. The LED assembly 196 is configured to insert into and to be removed from the enclosure 198 as generally indicated by arrow 500. For example, to replace portions of the LED assembly 196 (e.g., the LED arrays 182, the PCBs 302, the base PCB 304, wiring, etc.), the LED assembly 196 and the enclosure 198 may be disassembled by removing the LED assembly 196 from the enclosure 198 along an axis generally parallel to arrow 500. Additionally, while the LED assembly 196 and the enclosure 198 are disposed in the illustrated positions (e.g., with the LED assembly 196 and the enclosure 198 extending downwardly), the LED assembly 196 may be removed from the enclosure 198 with a minimal loss and/or splashing of the fluid using threaded enclosures, a gasket, a latch, and/or other securing mechanisms. To assemble/reassemble the LED assembly 196 into the enclosure 198, the LED assembly 196 may be inserted into the enclosure 198 along the axis generally parallel to the arrow 500. Thus, the configuration and coupling of the LED assembly 196 and the enclosure 198 described herein may facilitate quick and easy maintenance of the LED assembly 196.

Figure 11:
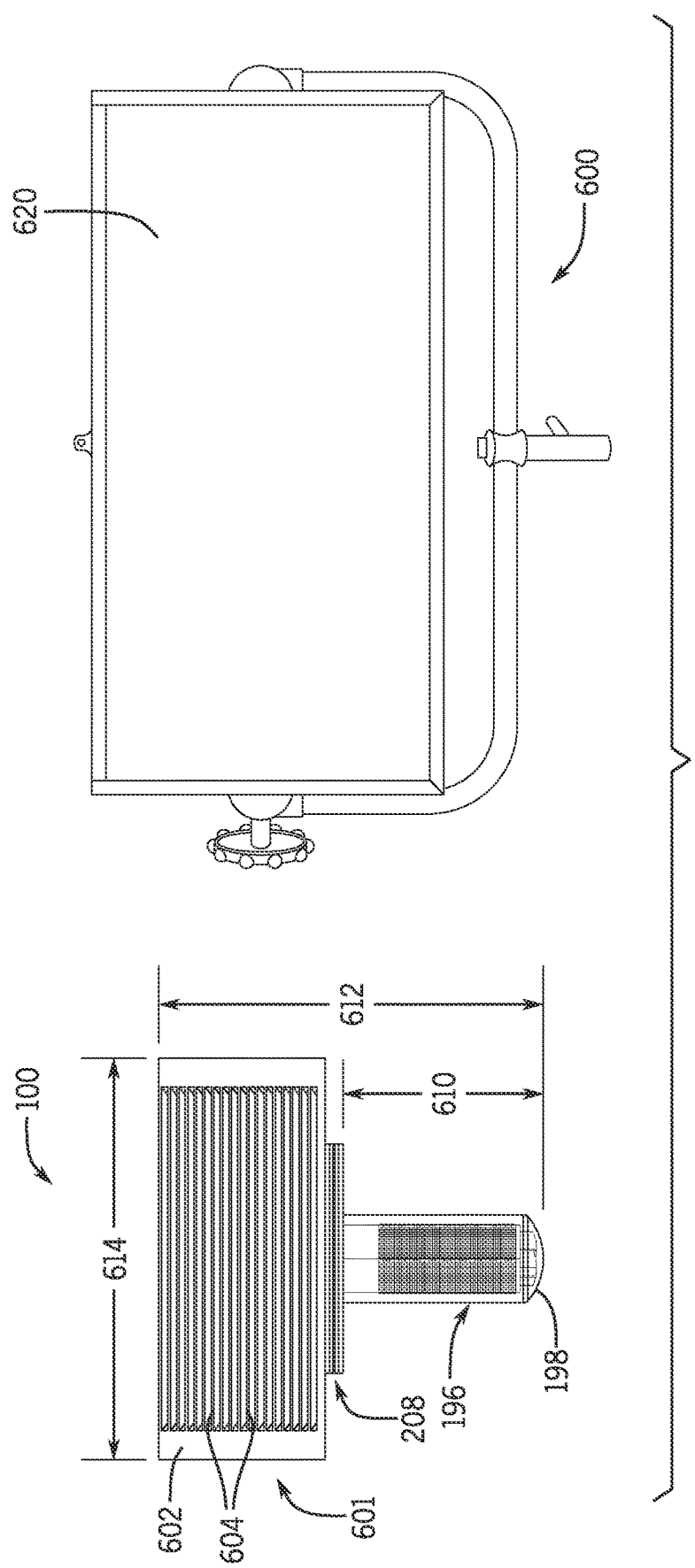
FIG. 11 is a side view of the cooling system of FIG. 7 and a side view of an embodiment of a lighting assembly, in accordance with one or more current embodiments.

FIG. 11 is a side view of the cooling system 100 of FIG. 7 and a side view of a lighting assembly 600. As illustrated, the base 208 of the enclosure 198 is coupled to a heat exchanger 601. After absorbing heat from and at the LED assembly 196, the fluid is configured to flow into and through the heat exchanger 601. The heat exchanger 601 includes a radiator 602 configured to exchange heat from the fluid to ambient air adjacent to the heat exchanger 601. The heat exchanger 601 may include the radiator 602 on each of four sides of the heat exchanger 601 (e.g., four radiators 602). In certain embodiments, the heat exchanger 601 may include more of fewer sides with each side having the radiator 602. The radiator 602 includes fins 604 configured to transfer heat from the fluid (e.g., to absorb heat from the fluid) to the ambient air. In some embodiments, the heat exchanger 601 may include other shapes configured to cool the fluid (e.g., a sphere, a cylinder, etc.).

The LED arrays 182 of the LED assembly 196 extend outwardly from the base 208 of the enclosure 198 a distance 610. In certain embodiments, the distance 610 may be between about 3 inches and about 9 inches. In some embodiments, the distance 610 may be about 5 and one-half inches. Additionally, the cooling system 100 extends a generally vertical distance 612 and a generally horizontal distance 614. In certain embodiments, the generally vertical distance 612 may between about 10 inches and about 20 inches, and/or the generally horizontal distance 614 may be between about 7 inches and about 17 inches. In some embodiments, the generally vertical distance 612 may be 14 inches, and/or the generally horizontal distance 614 may be 12 inches.

The lighting assembly 600 is a prior art lighting assembly having a lighting area 620 configured to emit light. A back portion of the lighting area 620 may be a heat sink configured to absorb/transfer heat from the lighting area 620. As illustrated, the cooling system 100 is generally smaller and more compact than the lighting area 620 and the heat sink of the lighting assembly 600. Additionally, as generally described above, the cooling system 100 is configured to provide sufficient cooling for the LED assembly 196 as the LED assembly 196 operates at 1500 W. The lighting assembly 600 may be configured to provide cooling for lights of the lighting area 620 operating at 400 W. As such, the cooling system 100 may be more versatile than the lighting assembly 600, and prior art lighting assemblies generally, by providing a more compact design configured to operate at significantly higher powers. In certain embodiments, the LED assembly 102 and/or the enclosure 104 of the cooling system 100 may be coupled to the heat exchanger 601, such that the heat exchanger 601 is configured to exchange heat with the fluid circulating through the LED assembly 102 and the enclosure 104.

Figure 12:
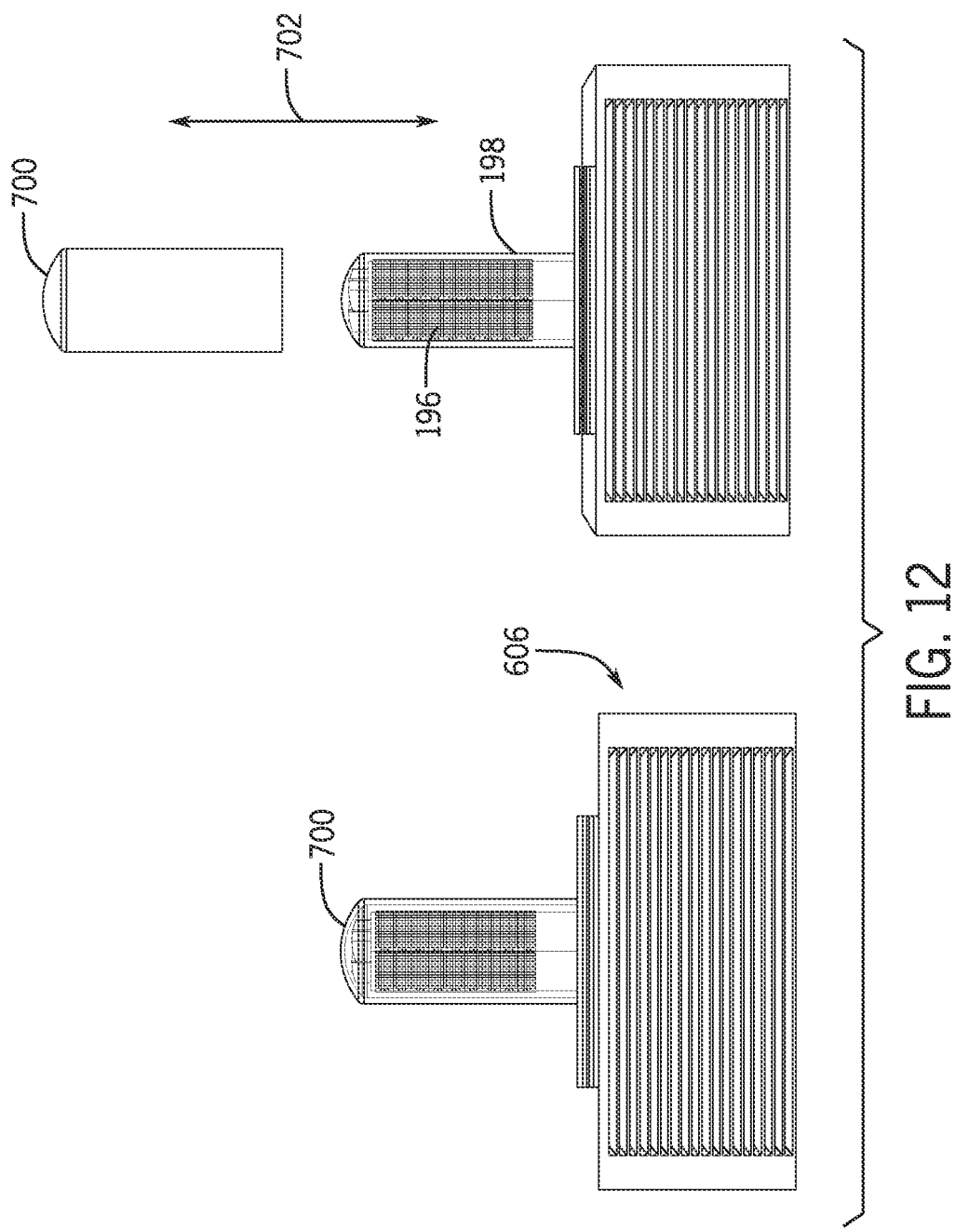
FIG. 12 includes side views of the cooling system of FIG. 7, in accordance with one or more current embodiments.

FIG. 12 includes side views of the cooling system 100 of FIG. 7. The cooling system 100 includes a cover 700 configured to fit over/onto the enclosure 198. The cover 700 includes materials configured to convert a color correlated temperature ("CCT") of light emitted by the LED assembly 196. For example, the cover 700 may include and/or be formed of phosphor and may be configured to convert a cool white CCT of about 5600K to a warmer white CCT of about 4300K, about 3200K, and other CCT's. In certain embodiments, the cover 700 may be injection molded plastic, silicone, coated glass, or a combination thereof. In certain embodiments, the cover 700 may fit over/onto the enclosure 104, such that the cover 700 converts a CCT of light emitted by the LED assembly 102 through the enclosure 104.

The cover 700 is configured to slide onto and off of the enclosure 198, as generally noted by arrow 702. For example, the cover 700 may be easily field changeable such that an operator may slide the cover 700 onto and off of the enclosure 198. Additionally, light produced by a low-cost single-color version of the LED assembly 196 may easily be converted to any CCT with the addition of the cover 700, which may be of relatively low cost. Further, the cover 700 may be significantly more power efficient compared to traditional embodiments, because the cover 700 is not a filter removing a portion of light emitted by the LED assembly 196. Instead, the cover 700 is configured to convert light to a desired color and CCT.

In certain embodiments, the LED assembly 196 may be configured to emit a blue light, cool white light (e.g., 5000K or higher), or other colors. The cover 700 may adapted for any suitable color and/or white such that light emitted from a single-color version of the LED assembly 196 (e.g., a blue light LED assembly 196 or a cool white light LED assembly 196) may be converted into any CCT and/or any color with no change to the LED assembly 196 or other electronics of the cooling system 100.

As illustrated, the cover 700 is configured to contact the enclosure 198 while the cover 700 is disposed on the enclosure 198. The contact between enclosure 198 and the cover 700 may allow the enclosure 198 to transfer heat to the cover 700. The fluid flowing within the enclosure 198 may be configured to cool both enclosure 198 and the cover 700 (e.g., the fluid may absorb heat from the enclosure 198 to facilitate cooling of the cover 700).

Figure 13:
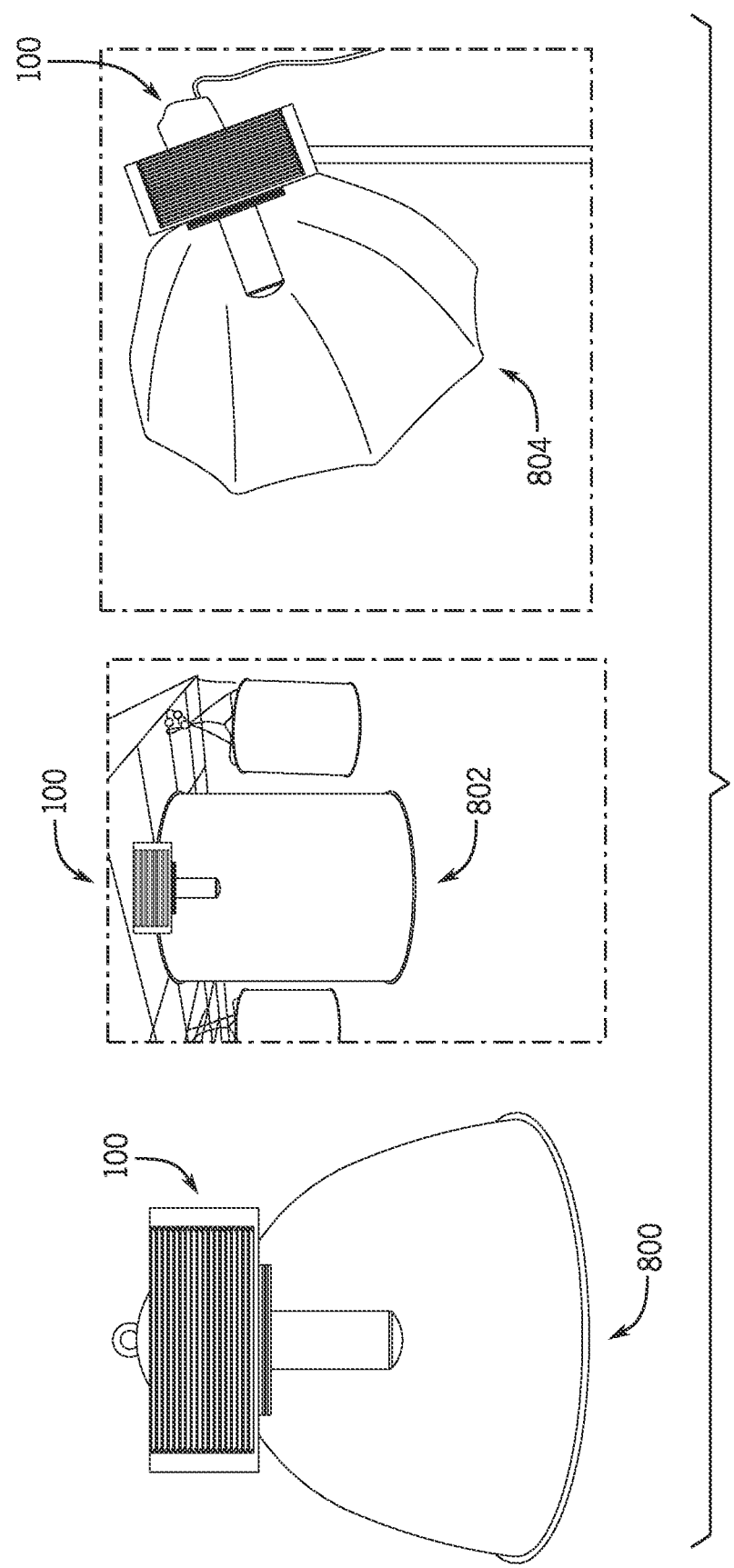
FIG. 13 includes perspective views of the cooling system of FIG. 7 coupled to light directing assemblies, in accordance with one or more current embodiments.

FIG. 13 includes perspective views of the cooling system 100 of FIG. 7 coupled to light directing assemblies 800, 802, and 804 configured to direct light emitted by the LED assembly 102 of the cooling system 100. For example, the light directing assembly 800 is a high bay assembly configured to be disposed in building setting and to direct light emitted by the LED assembly 102 downwardly. The light directing assembly 802 is a space light directing assembly configured to be disposed in a studio to provide environment lighting. Additionally, the light directing assembly 804 is an umbrella assembly configured to be disposed in a studio and to generally focus light emitted by the LED assembly 102.

Figure 14:
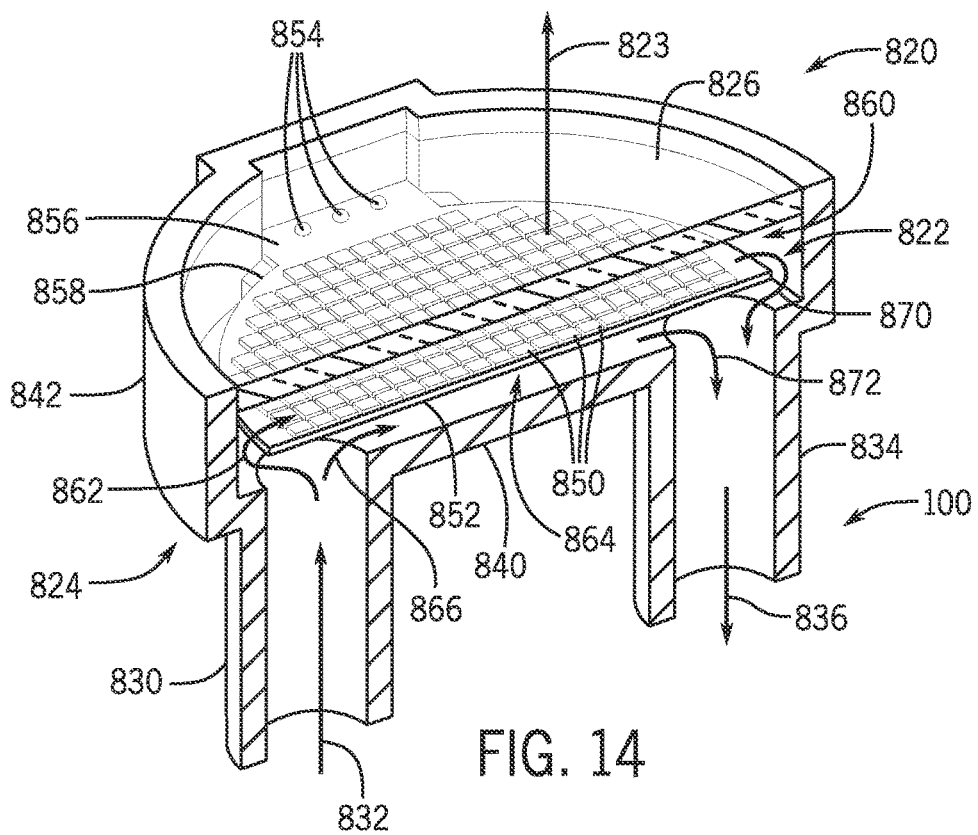
FIG. 14 is a perspective cross-sectional view of another embodiment of a lighting assembly having the LED assembly and the cooling system of FIG. 1, in accordance with one or more current embodiments.

FIG. 14 is a perspective cross-sectional view of another embodiment of a lighting assembly 820 having an LED assembly 822 and the cooling system 100 of FIG. 1. The lighting assembly 820 is a front emission configuration of a lighting assembly that may be included in the cooling system 100, such that the lighting assembly 820 is configured to emit light outwardly through a front portion of the lighting assembly 820, as indicated by arrow 823, rather than through side of a lighting assembly (e.g., as in lighting assembly embodiments of FIGS. 2-13). Accordingly, the cooling system 100 may include a lighting assembly having a side emission configuration, a front emission configuration, and/or others.

The lighting assembly 820 includes a chassis 824 configured to receive and flow the fluid to cool the LED assembly 822. As illustrated, the LED assembly 822 is disposed within and mounted to the chassis 824. Additionally, the lighting assembly 820 includes a cover 826 coupled to the chassis 824. The cover 826 is configured to at least partially enclose the lighting assembly 820, such that the cover 826 directs the fluid through the lighting assembly 820 and over the LED assembly 822. Additionally, the cover 826 may include clear, transparent, and/or semi-transparent materials such that the light emitted by the LED assembly 822 may pass through the cover 826 (e.g., after passing through the fluid) and outwardly from the cover 826. For example, the cover 826 may be formed of a clear plastic and/or glass (e.g., borosilicate glass). In certain embodiments, the cover 826 may include poly(methyl methacrylate) ("PMMA") and/or other acrylics and/or other materials described herein.

The chassis 824 includes a fluid inlet 830 configured to receive the fluid flowing along the cooling circuit 110 (e.g., as indicated by arrow 832) and a fluid outlet 834 configured to flow the fluid from the chassis 824 to the cooling circuit 110 (e.g., as indicated by arrow 836) (although the fluid direction may be reversed such that the fluid enters through the fluid outlet 834, for example, and exits through the fluid inlet 830). Additionally, the chassis 824 includes a base 840 and a cylinder 842 extending from the base 840. The base 840 includes the fluid inlet 830 and the fluid outlet 834. In certain embodiments, the LED assembly 822 and/or the chassis 824 may be included in the lighting assembly and/or LED assembly of FIGS. 2-13.

The LED assembly 822 includes LEDs 850 mounted to a PCB 852. The PCB 852 is mounted to the chassis 824 via connections 854. For example, the PCB 852 includes a tab 856 extending over a ledge 858 of the chassis 824. The connections 854 secure the LED assembly 822 to the ledge 858. Additionally, the connections 854 may be electrical connections configured to provide power and/or electrical connections to the LEDs 850. In certain embodiments, the PCB 852 may include an additional tab 856 disposed generally opposite the illustrated tab 856 and configured to mount to an additional ledge 858 of the chassis 824. However, the additional tab 856 and the additional ledge 858 are omitted in FIG. 14 for purposes of clarity.

The LEDs 850 of the LED assembly 822 are configured to emit light outwardly through the fluid flowing between the LED assembly 822 and the cover 826 (e.g., through an upper passage 860 of the cooling system 100) and through the cover 826. In some embodiments, the cover 826 enclosing the fluid may be acrylic, polycarbonate, glass (e.g., borosilicate glass), or another material having a refractive index between about 1.44-1.5. Additionally, the refractive index of the LEDs 850 (e.g., the silicone), the fluid, and/or the cover 826 may generally be matched (e.g., within a difference threshold).

The cooling system 100 is configured to flow the fluid into the fluid inlet 830, into the upper passage 860 extending between the LED assembly 822 and the cover 826 (e.g., as indicated by arrow 862), and into a lower passage 864 extending between the LED assembly 822 and the base 840 of the chassis 824 (e.g., as indicated by arrow 866). The fluid is configured to absorb heat generated by the LED assembly 822 (e.g., due to operation of the LEDs 850 and the PCB 852 and the light emitted by the LEDs 850) as the fluid flow through the upper passage 860 and the lower passage 864. Additionally, because the fluid is generally transparent and/or semi-transparent (e.g., the fluid has a refractive index generally between 1.4-1.5), the fluid may have minimal/no effects on the light emitted from the LED assembly 822 and through the fluid. As such, the fluid may actively cool the LED assembly 822 during operation of the LED assembly 822 with little to no effect on a quality of light emitted from the LED assembly 822.

The cooling system 100 is configured to flow the fluid from the upper passage 860 and into the fluid outlet 834, as indicated by arrow 870, and from the lower passage 864 into the fluid outlet 834, as indicated by arrow 872. After flowing the fluid over the LED assembly 822 and into the fluid outlet 834, the pump 108 circulates the fluid through a heat exchanger 106 of the cooling system 100, for example, to cool the fluid.

Figure 15:
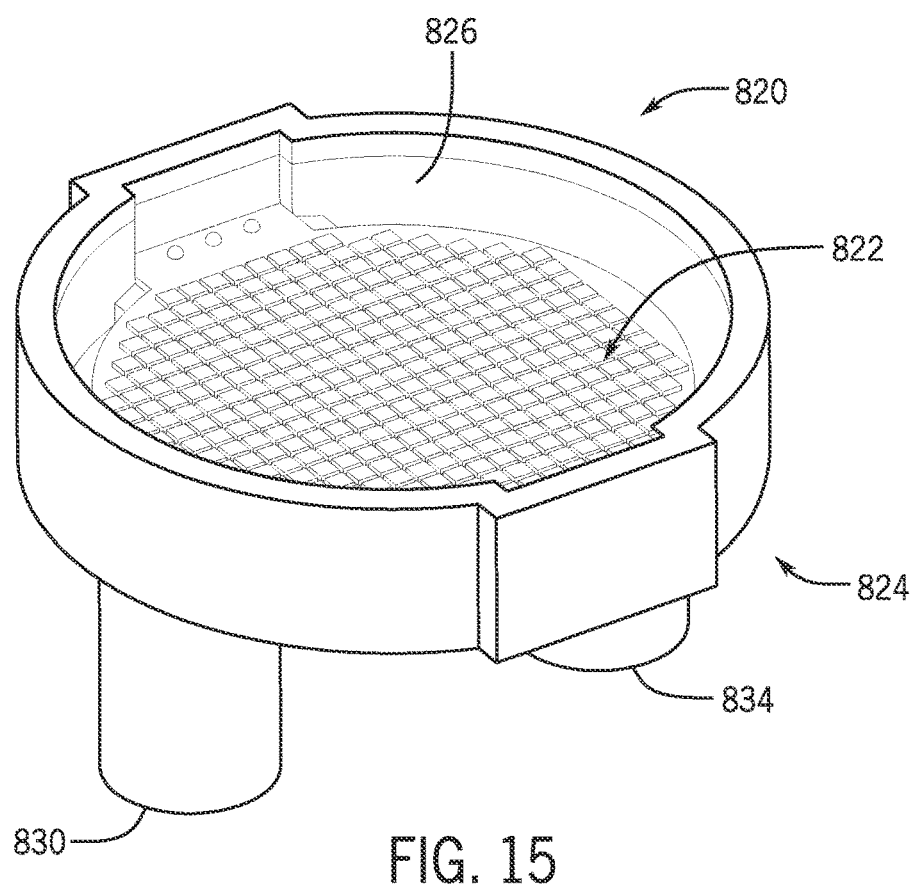
FIG. 15 is a perspective view of the lighting assembly of FIG. 14, in accordance with one or more current embodiments.

FIG. 15 is a perspective view of the lighting assembly 820 of FIG. 14. As described above, the cooling system 100 is configured to circulate the fluid into the fluid inlet 830 of the chassis 824, over the LED assembly 822 of the lighting assembly 820, and through the fluid outlet 834, thereby cooling the LED assembly 822. Accordingly, the lighting assembly 820 of FIGS. 14 and 15 provides a front emission configuration of a lighting assembly and LED assembly that may be cooled via the cooling system 100.

Figure 16:
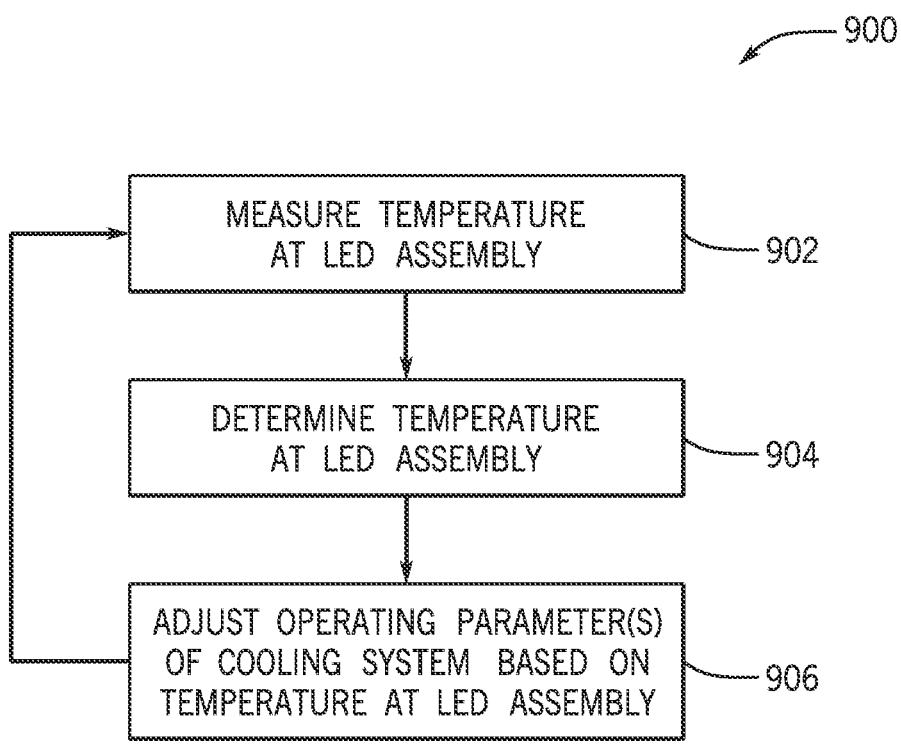
FIG. 16 is a flow diagram of an embodiment of a method for controlling the cooling system of FIGS. 1-15, in accordance with one or more current embodiments.

FIG. 16 is a flow diagram of a method 900 for controlling the cooling system 100 of FIG. 1. For example, the method 900, or portions thereof, may be performed by the controller 120 of the cooling system 100. The method 900 begins at block 902, where the temperature at an LED assembly (e.g., the LED assembly 102/196) is measured. The sensor 121 may measure the temperature and output a signal (e.g., an input signal to the controller 120) indicative of the temperature at or adjacent to the LED assembly (e.g., a temperature at a surface of the LED assembly, a temperature of the fluid adjacent to and/or flowing over the LED assembly, a temperature at a surface of the enclosure 104/198, etc.). The controller 120 may receive the signal indicative of the temperature.

At block 904, the temperature at the LED assembly is determined. Block 904 may be performed in addition to or in place of block 902. For example, block 902 may be omitted from the method 900, and the sensor 121 may be omitted from the cooling system 100. The controller 120 may be configured to determine the temperature at the LED assembly based on whether the LED assembly, or portions thereof, are emitting light and based on an amount of time that the LED assembly, or the portions thereof, have been emitting light. As generally described above, the controller 120 may be configured to control the LED assembly (e.g., by controlling which LED arrays 182 are emitting light, a duration that the LED arrays 182 emit light, an intensity of the light emitted by the LED arrays 182, etc.). Based on the control actions, the controller 120 may determine/estimate the temperature at the LED assembly (e.g., the temperature at the surface of the LED assembly 102/196, the temperature of the fluid adjacent to and/or flowing over the LED assembly 102/196, the temperature at the surface of the enclosure 104/198, etc.).

At block 906, operating parameter(s) of the cooling system 100 are adjusted based on the temperature at the LED assembly (e.g., the temperature measured at block 902 and/or determined at block 904). For example, the controller 120 may output a signal (e.g., an output signal) to the pump 108 indicative of instructions to adjust the flowrate of fluid through the cooling circuit 110. Additionally or alternatively, the controller 120 may output a signal to a heat exchanger (e.g., the heat exchanger 106/601) indicative of instructions to adjust a flow rate of air flowing over a radiator of the heat exchanger (e.g., by outputting a signal to fans of the heat exchanger 106/601 indicative of instructions to adjust a rotational speed of the fans to adjust the flow rate of air). In certain embodiments, the controller 120 may control the LED assembly based on the temperature at the LED assembly, such as by reducing a number of LED arrays emitting light and/or to prevent overheating of the LED assembly.

In certain embodiments, the controller 120 may compare the temperature at the LED assembly to a target temperature and determine whether a difference between the temperature (e.g., a measured and/or determined temperature at the LED assembly 102/196) and the target temperature is greater than a threshold value. Based on the difference exceeding the threshold value, the controller 120 may control the operating parameters of the cooling system 100 described above. As such, the controller 120 may reduce certain control actions performed by the cooling system 100 based on minor temperature fluctuations and/or may reduce an amount of air flow and/or power used by the heat exchanger to cool the fluid. The controller 120 may receive an input indicative of the target temperature (e.g., from an operator of the cooling system 100) and/or may determine the target temperature based on a type of LED included in the LED assembly, a type of fluid circulating through the cooling system 100, a material of the enclosure, a material of the tower of the LED assembly, a size of the LED assembly and/or the cooling system 100 generally, or a combination thereof.

After completing block 906, the method 900 returns to block 902 and the next temperature at the LED assembly is measured. Alternatively, the method 900 may return to block 904, and the next temperature at the LED assembly may be determined. As such, blocks 902-906 of the method 900 may be iteratively performed by the controller 120 and/or by the cooling system 100 generally to facilitate cooling of the LED assembly and the enclosure.

In the above embodiments, immersion cooling enables new levels of power density (e.g., predetermined power density) in LED lighting. For example, the immersion cooling techniques described above enable operation of LED assemblies at over 100 W per square inch, with a compact "LED lamp" capable of 1,500 W of power with a less than 3-inch diameter. This has previously not been done with air-cooled LED products. Additional increases to thermal efficiency of immersion cooling by twice as much or more may create further opportunity for even greater power density of LED sources. This would enable more compact lightings systems, much higher beam power and focus capabilities, and lower system costs. An improvement to the aforementioned techniques is the concept of "heatsink enhanced immersion cooling," which may increase the immersion power density to exceed 200 W per square inch.

Thermal—the Limiting LED Factor

It has been shown that LED power density is not limited by the capacity of the LED semiconductor material to convert electrical energy (watts) into light. Instead, LED power density is limited by thermal deterioration (e.g., extracting the heat from the compact LED light source is the challenge). The conversion of electrical power to light with blue LEDs typically has a WPE (Wall Plug Efficiency) of about 50%. Blue activated phosphors are then deposited on top to create white light. For white LEDs, about 30-40% of the electrical energy is converted into light. The rest of the energy (up to 70% or more) is converted into heat. The challenge when creating a densely packed array of compact LEDs is how to extract the heat to maintain the LEDs at an operating temperature that does not deteriorate or that reduces deterioration of the LEDs. LEDs typically have a maximum operating temperature between 105-125 Celsius. The actual LED semiconductor itself may only be 1 mm square or smaller. Inside the LED package, a thermal pad is used to transfer heat from the compact die to a larger metal pad on the package. As previously described, many LED systems use air cooling, which limits the amount of LED power density that the air-cooled LED systems may achieve without deteriorating the LEDs.

FIG. 17 is an embodiment similar to those described above with respect to an LED array immersed in a coolant within a flow path for cooling. More specifically, FIG. 17 is a cross-sectional view of an LED assembly 1000 (e.g., LED device) including a substrate 1002 and an LED array 1004 that includes LEDs 1006 coupled to the substrate 1002. The substrate 1002 may be an aluminum nitrate (AlNi) substrate, may include other materials, and/or may be another type of substrate. Coolant may enter, as indicated by arrow 1008, from a heat exchanger external to the LED assembly 1000, such as a heat exchanger similar to the heat exchanger 106 described in reference to FIG. 1. As the coolant passes over a bottom side 1010 of the LED assembly 1000, the coolant removes some of the heat from the LED assembly 1000. Next, the coolant flows around the LED assembly 1000, as indicated by arrow 1012, and over a top side 1014 of the LED assembly 1000, as indicated by arrow 1016, further cooling the LED assembly 1000 and taking heat back out to the heat exchanger. In this embodiment, the total surface area contacting the coolant may be the surface area of the LED array 1004 and the substrate 1002. Immersion cooling dramatically increases the efficiency of LED cooling by immersing the LED assembly 1000 into an optically clear liquid enclosure filled with the coolant (e.g., a dielectric coolant fluid). Both the face and the back (e.g., the substrate 1002) of the LEDs 1006 are in direct contact with the coolant. The actual cooling of the coolant is done remotely using the external heat exchanger (e.g., a radiator) and a fan that transfers the heat from the coolant to the air. This enables a compact light source, because the LED assembly 1000 is no longer required to be the same size as the heat sink required to cool the LED assembly 1000. The present disclosure further enhances the cooling capacity of LED cooling immersion systems.

Benefits of a Compact LED Source

Immersion cooling allows more LEDs to be packed into a smaller light source. Benefits of immersion cooling may include smaller lighting fixtures, lower costs of lighting fixtures, and high intensity narrow beam applications, among other benefits. In particular, for spot lighting applications, the size of the LED source and the desired beam angle may determine a size of reflector needed to reflect light emitted from the LED source. For example, in a traditional application utilizing a 3-inch diameter LED source and a 24-inch reflector that may achieve 15-degree lighting spot or less, a similar 1.5-inch diameter source may be used with a 12-inch reflector for the same beam angle and output power using immersive cooling. With respect to lower costs, the number of LEDs used, and the size of fixtures and cooling systems are based on thermal requirements needed to hit reliability targets. If a more efficient cooling system is used, less LEDs may be used to generate the light at higher light output densities. In other words, the LEDs may be driven harder while using less of them. Smaller fixtures and less LEDs reduce costs while maintaining the same output performance. Additionally, for many applications like stage lighting, 12K HMI and Tungsten fixtures with narrow beam control (Fresnels, Molebeam, Arri M Series) are often used instead of traditional LED lighting systems. This is predominantly due to many LED lighting systems not being cooled efficiently while operated at greater than 100 W/in$^2$ in large light sources (100 W or more). Traditional Tungsten and HMI lamp filaments are much more compact, especially at higher power levels (5,000 watts and above), and therefore allow for better beam control. But as the size of the LED array gets more compact, this may limit the amount of heat transfer into the coolant. Accordingly, the present disclosure provides cooling systems for LED assemblies that efficiently transfer heat to coolant, including, but not limited to, high intensity narrow beam applications where the cooling systems and LED assemblies may replace the traditional HMI and Tungsten fixtures.

As described above, a limiting factor to LED power density in immersion cooling may be the transfer of heat from the LED array into the flowing coolant. The compact LED arrays may be cooled consistently and effectively up to greater than 100 W/in$^2$ without any enhancement. But when LED arrays become too small to transfer all of the LED heat into the flowing fluid by itself, additional heat transfer techniques may be used to increase the effective surface area of the LED array, so more heat may be efficiently transferred to the coolant.

FIG. 18 is a cross-sectional view of an embodiment of an LED assembly 1040 (e.g., LED device) including a substrate 1042 and an LED array 1044 coupled to the substrate 1042. As illustrated, the LED array 1044 includes LEDs 1046 coupled to the substrate 1042. Additionally, a cooling system including a heat exchanger 1048 (e.g., a heat sink) is coupled to the LED assembly 1040. The heat exchanger 1048 may be made of a number suitable materials including copper, aluminum, carbon fiber, graphite, AlNi, nanotubes, synthetic diamond, sapphire, and/or types of phononic thermal conducting ceramics and crystal structures. The heat exchanger 1048 may also have a configuration different from the configuration shown in FIG. 18. In certain embodiments, the LED assembly 1040 may include the heat exchanger 1048 and/or other portions of the cooling system.

By attaching the heat exchanger 1048 to the substrate 1042, the total surface area contacting the coolant may include a surface 1050 of the LED assembly 1040 (e.g., one or more surfaces of the LEDs 1046) and a surface 1052 of the heat exchanger 1048 (e.g., one or more surfaces of the heat exchanger 1048), which may more than double the contact surface area relative to traditional lighting systems. For example, coolant may enter, as indicated by arrow 1060, from a heat exchanger external to the LED assembly 1040 and the heat exchanger 1048, such as a heat exchanger similar to the heat exchanger 106 described in reference to FIG. 1. As the coolant passes over the surface 1052 of the heat exchanger 1048, the coolant removes heat from the heat exchanger 1048. Next, the coolant flows around the LED assembly 1040 and the heat exchanger 1048, as indicated by arrow 1062, and over the surface 1050 of the LED assembly 1040, as indicated by arrow 1064, further cooling the LED assembly 1040 and taking heat back out to the external heat exchanger. Additionally, the heat exchanger 106 is arranged behind the LED assembly 1040 relative to the LEDs 1046 so as not to interfere with light emitted from the LEDs 1046.

As sizes of the LED assembly 1040 become more compact, such use of the heat exchanger 1048 creates additional surface area for heat transfer with the coolant, which enables high-power LED arrays to be supported in a smaller footprint. For example, the heat exchanger 1048 may increase a surface area contacting the coolant by twice as much or more and may have approximately the same thermal performance and stability relative to traditional LED cooling systems with little or no other changes to the LED assembly 1040 or the associated cooling system.

The heat exchanger 1048 includes a base 1070 coupled to the substrate 1042 and fins 1072 extending from the base 1070. As illustrated, the fins 1072 are straight and extend generally perpendicular from the base 1070. In certain embodiments, the heat exchanger 1048 may be oriented such that a length of the fins 1072 are generally parallel to a direction of coolant flow. Additionally or alternatively, the fins 1072 may be curved, waved, or have a different geometry relative to the illustrated embodiment of FIG. 18 to create additional surface area while still being substantially parallel to the direction of flow.

Figure 19A:
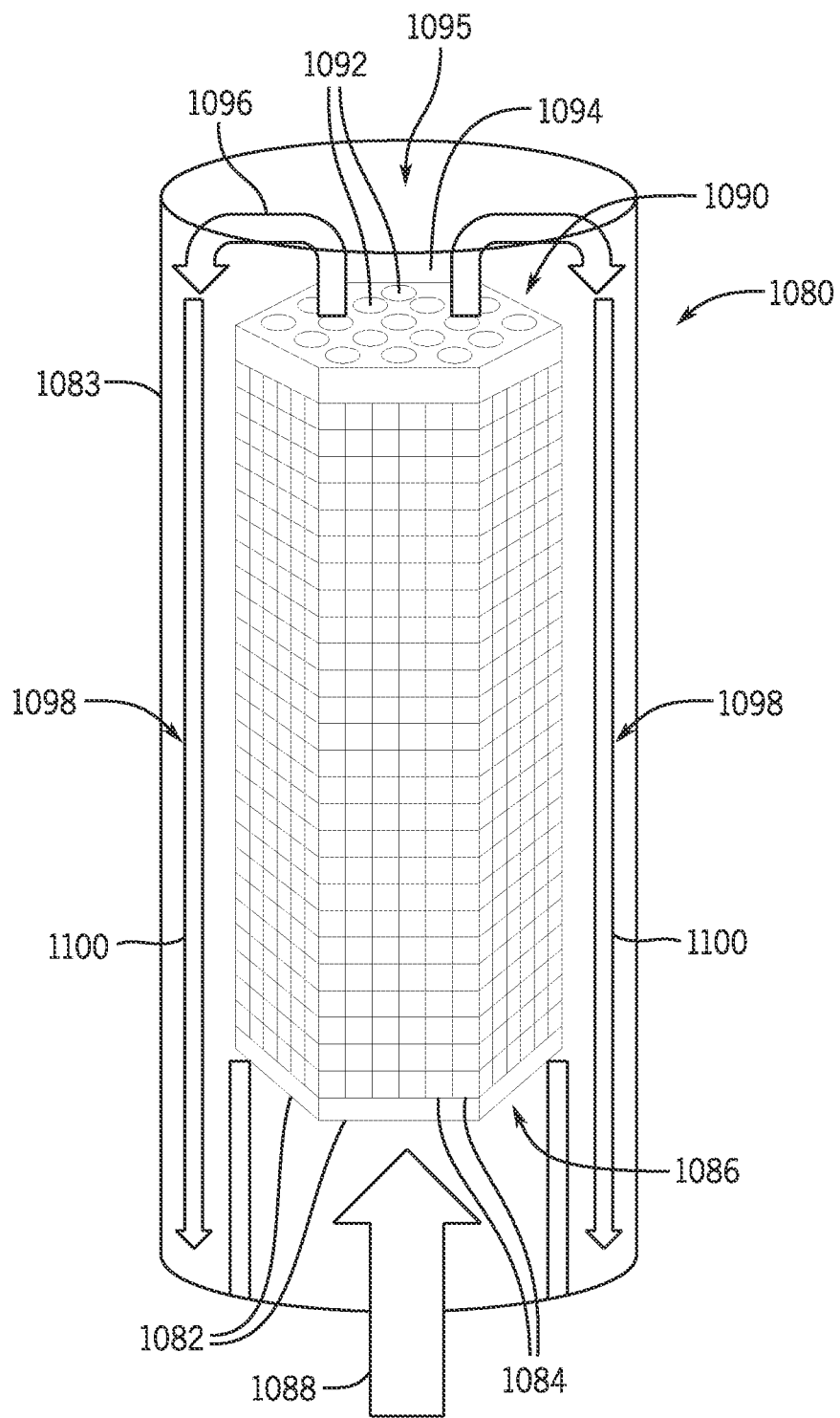
FIG. 19A is a perspective view of an embodiment of an LED assembly having a cooling system with multiple heat exchangers for immersion cooling, in accordance with one or more current embodiments.

FIG. 19A is a perspective view of an embodiment of an LED assembly 1080 (e.g., LED device) having a cooling system with multiple heat exchangers for immersion cooling. The LED assembly 1080 includes panels 1082, and each panel 1082 includes LED arrays 1084, such as LED arrays similar to the LED array 1044 shown in FIG. 18. As illustrated, the LED assembly 1080 includes six panels 1082, such that the panels 1082 form a hexagonal prism. In certain embodiments, the LED assembly 1080 may include more or fewer panels 1082 (e.g., three panels 1082, four panels 1082, five panels 1082, seven panels 1082, ten panels 1082, twenty panels 1082), and/or the LED assembly 1080 may include other shapes and/or configurations. Additionally, the LED assembly 1080 is disposed in an enclosure 1083, which may be similar to the enclosure 104 described above. In certain embodiments, the LED assembly 1080 may include the enclosure 1083.

Coolant may enter an end 1094 of the LED assembly 1080, as indicated by arrow 1088, such as through holes or vias of the LED assembly 1080 that act as coolant paths. The coolant may flow from the end 1094, through the LED assembly 1080, and out an end 1090 of the LED assembly 1080 disposed generally opposite the end 1094. The coolant may pass through an inner annular passage of the LED assembly 1080 formed between the panels 1082. A heat exchanger may be disposed in the inner annular passage and/or may form the inner annular passage. For example, the heat exchanger may be coupled to an interior side of the panels 1082 (e.g., to substrates of the LED arrays 1084) and may exchange heat between the LED arrays 1084 and the coolant flowing through the inner annular passage. In certain embodiments, the LED assembly 1080 may include the heat exchanger.

The coolant may exit the LED assembly 1080 through apertures 1092 (e.g., holes, vias) and enter an end passage 1095 formed between the LED assembly 1080 and the enclosure 1083. As indicated by arrows 1096, the coolant may flow from the end 1090 of the LED assembly 1080, through the end passage 1095, and into an outer annular passage 1098 formed between the panels 1082 and the enclosure 1083. At the outer annular passage 1098, the coolant flows over each LED array 1084, as indicated by arrows 1100, thereby absorbing additional heat from the LED arrays 1084 (e.g., from faces of LEDs of the LED arrays 1084). Accordingly, the coolant may provide additional cooling at the LED arrays 1084. As described herein, the coolant may be transparent or semi-transparent to allow light emitted from the LED arrays 1084 to pass through the coolant and the enclosure 1083. A total surface area of LEDs of the LED arrays 1084 exposed to the fluid for cooling may be greater than 40 square inches, greater than 50 square inches, equal to 54 square inches, greater than 60 square inches, greater than 70 square inches, greater than 80 square inches, equal to 84 square inches, greater 90 square inches, or other suitable surface areas. In certain embodiments, this surface area may be a total surface area of the LED assembly 1080 (e.g., a surface area of the LEDs of the LED arrays 1084 and a surface area of the substrates of the LED arrays 1084) exposed to the fluid for cooling. A diameter of the LED assembly 1080 may have a range between 1 inch and 3 inches or may have another suitable diameter.

Figure 19B:
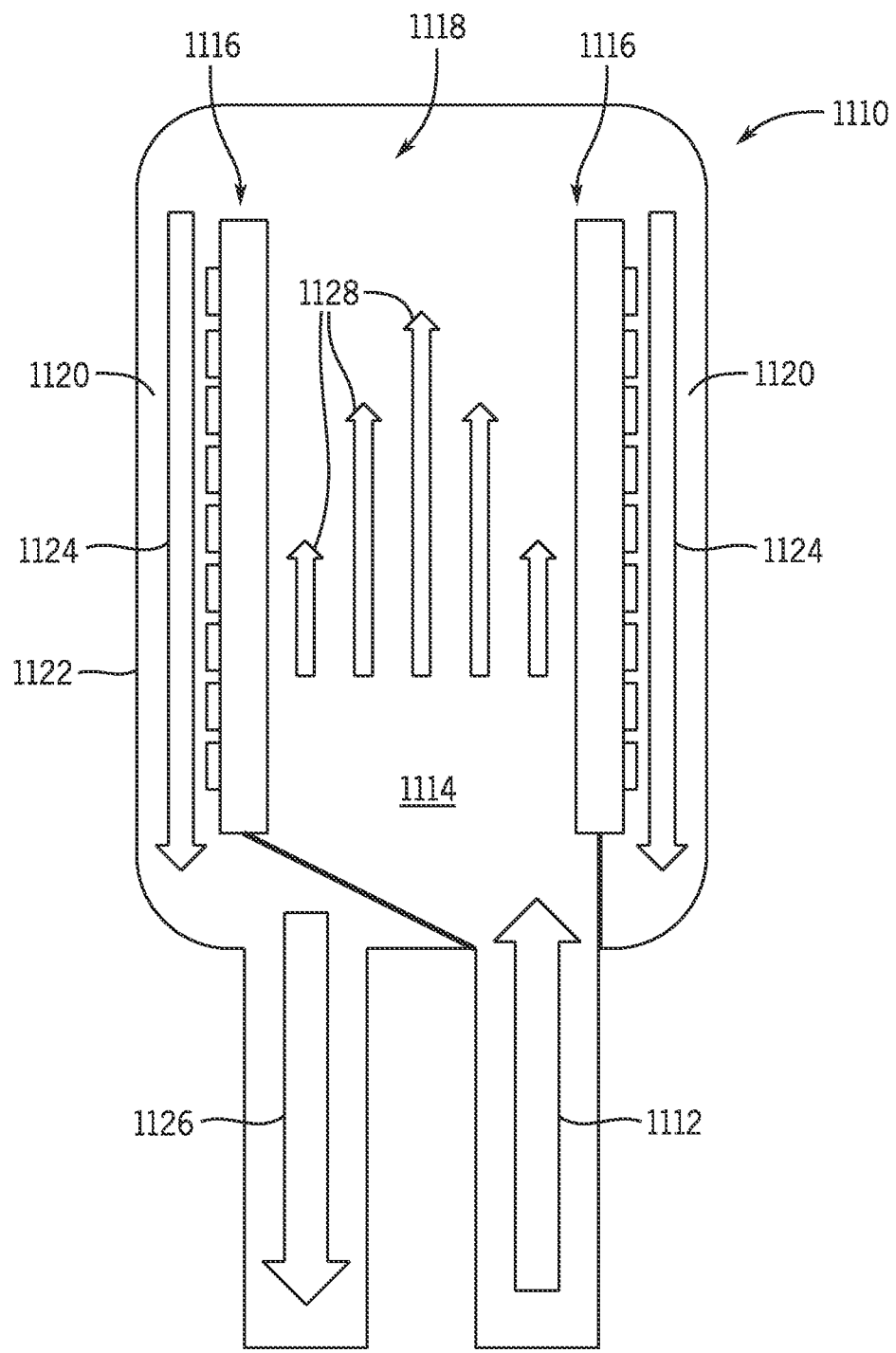
FIG. 19B is a side cross-sectional view of an embodiment of an LED assembly with coolant having a laminar flow, in accordance with one or more current embodiments.

The coolant path design affects the amount of heat that can be drawn away from a heat exchanger by the coolant. In particular, coolant paths that allow unheated coolant to pass around the LEDs of the LED assembly 1080 and the heat exchanger (e.g., the heat exchanger disposed within the LED assembly 1080) without being heated should be avoided, because such coolant paths waste thermal capacity. In particular, coolant paths with laminar flows, as shown in FIG. 19B, characterized by coolant that flows in smooth or regular paths without mixing, are an example of the type coolant path that should be avoided, because thermal capacity is wasted. As illustrated, in FIG. 19B, an LED assembly 1110 may receive coolant, as indicated by arrow 1112, which flows through an inner annular passage 1114 formed between LED arrays 1116. The coolant may flow through an end passage 1118 and an outer annular passage 1120 formed between the LED arrays 1116 and an enclosure 1122, as indicated by arrows 1124. The enclosure 1122 may be similar to the enclosure 104 described above. The coolant then exits the outer annular passage 1120, as indicated by arrow 1126. As the coolant passes through the inner annular passage 1114, the flow of coolant may remain laminar (e.g., substantially laminar), as indicated by arrows 1128. For example, coolant boundary layers adjacent to the LED arrays 1116 in the inner annular passage 1114 may move significantly slower relative to inner coolant layers at an interior of the inner annular passage, such that the coolant at the inner coolant layers makes little contact with the LED arrays 1116. As a result, the coolant at the inner coolant layers absorbs little heat from the LED arrays 1116. Additionally, the flow of coolant through the outer annular passage 1120 may remain laminar (e.g., substantially laminar). Accordingly, the LED assembly 1110 of FIG. 19B may not achieve an optimal thermal capacity of the coolant via the laminar flow.

In turbulent flow, the fluid motion may exhibit chaotic changes in pressure and/or flow velocity. Turbulent flow and laminar flow may be characterized with a Reynolds number. The Reynolds number (Re) is defined by Equation 1 below:

$$Re = (\rho u L)/\mu \qquad \text{(Equation 1)}$$

Referring to Equation 1, $\rho$ is a density of the coolant (kg/m$^3$), u is a flow speed of the coolant (m/s), L is a characteristic linear dimension (m) such as a radius or diameter of a tube through which the coolant flows, and $\mu$ is a viscosity of the coolant. Generally, a Reynolds number of less than 2,000 indicates laminar flow, while a Reynold's number of greater than 2,000 indicates turbulent flow. The Reynolds number is directly related to the diameter of the flow path and the flow velocity. Thin tubes with high velocity flow will significantly increase the Reynolds number and move into a turbulent flow regime. Large open tubes and chambers with slower fluid velocity will more likely create laminar flow. Laminar flow is far less efficient at cooling because slow moving boundary layers form at the sides of the fluid path.

Accordingly, in reference to FIG. 19B, a flow rate of the fluid circulating through the inner annular passage 1114 may be increased, such that the fluid exhibits a Reynold's number greater than 2,000. The increased flow rate may generate turbulence at the LED arrays 1116 within the inner annular passage 1114, thereby increasing diffusion of the fluid (e.g., mixing of cooler and warmer fluids) and heat transfer between the fluid and the LED arrays 1116. After passing through the inner annular passage 1114, the fluid may enter the end passage 1118 and transition from the turbulent flow to a laminar flow. For example, a size (e.g., a volume) of the end passage 1118 may be large enough to facilitate slowing the fluid and transitioning the fluid to the laminar flow. As the fluid enters the outer annular passage 1120, the fluid may be laminar. The fluid may cool the LED arrays 1116 while in the laminar flow.

Another key contributor to creating turbulent flow is a roughness and a geometry of the pipe or fluid path. Rough surfaces, corrugated surfaces, and intentional features can be added to break up laminar flow and generate turbulent flow at much lower Reynolds numbers. Turbulent flow may profoundly increase (ten times or more) thermal transfer. For example, turbulent flow may be characterized by Eddies that interfere with and reduce boundary layers. Moody Charts are a common tool in the field of fluid dynamics to assist in predicting turbulent flow. Geometries of surfaces can also be designed to have features that create turbulent flow. Cross bars, crosscut, grated, stacked plates, baffles, chevrons, porous metals (e.g., porous copper) and various other geometries and designs may be used to increase the velocity and turbulence, thereby facilitating cooling of LEDs. Fluid path design should maximize diffusion of the fluid and should maximize exposure of the fluid to the heat exchanger. When possible, cross flow is shown to be more effective in cooling relative to parallel flow.

Figure 19C:
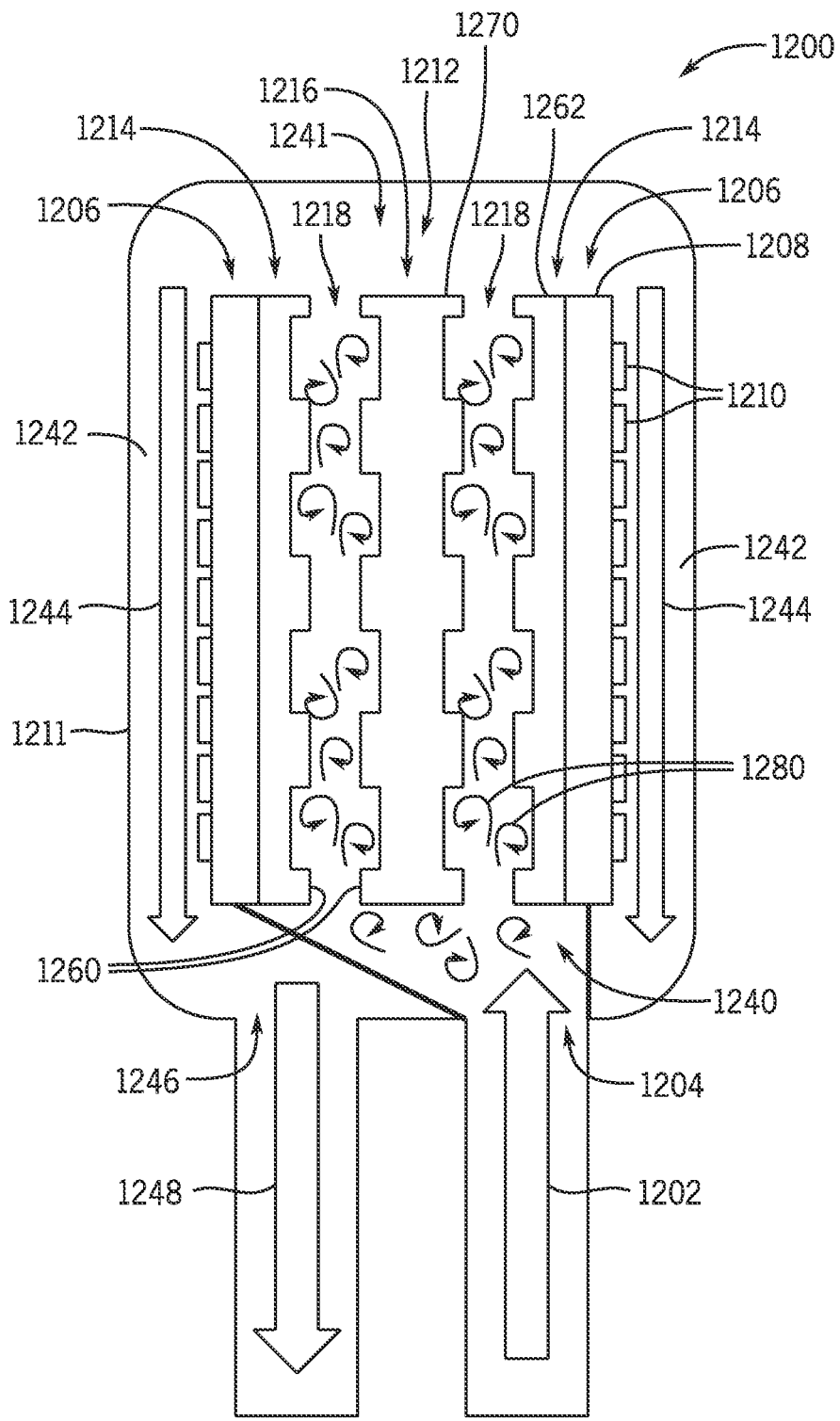
FIG. 19C is a side cross-sectional view of an embodiment of an LED assembly with coolant having a turbulent flow, in accordance with one or more current embodiments.

With the foregoing in mind, FIG. 19C is a side cross-sectional view of an embodiment of an LED assembly 1200 (e.g., LED device) with coolant having a turbulent flow, which is characterized by an irregular movement of fluid. The LED assembly 1200 may receive coolant, as indicated by arrow 1202, at an inlet 1204 of the LED assembly 1200. The LED assembly 1200 includes LED arrays 1206. Each LED array 1206 includes a substrate 1208 and LEDs 1210 coupled to the substrate 1208. Additionally, the LED assembly 1200 may include an enclosure 1211, and the LED arrays 1206 may be disposed within the enclosure 1211. The enclosure 1211 may be similar to the enclosure 104 described above.

A cooling system includes a heat exchanger 1212 coupled to the LED arrays 1206. In certain embodiments, the LED assembly 1200 may include the heat exchanger 1212 and/or other portions of the cooling system. As illustrated, the heat exchanger 1212 includes outer portions 1214 coupled to the substrates 1208 of the LED arrays 1206 and an inner portion 1216 disposed interior to the outer portions 1214. The inner portion 1216 may be coupled to the outer portions 1214, such as via one or more brackets extending between the inner portion 1216 and the outer portions 1214. Coolant passages 1218 are formed between the outer portions 1214 and the inner portion 1216 of the heat exchanger 1212, such that the heat exchanger 1212 may exchange heat between the LED arrays 1206 and the coolant as the coolant flows through the coolant passages 1218.

The coolant may flow into an inner annular passage 1240 of the LED assembly 1200. As illustrated, the heat exchanger 1212 is disposed in the inner annular passage 1240. The coolant may flow through the coolant passages 1218 formed in the heat exchanger 1212, through an end passage 1241 formed between the enclosure 1211, the LED arrays 1206, and the heat exchanger 1212, and through an outer annular passage 1242 formed between the LED arrays 1206 and the enclosure 1211, as indicated by arrows 1244. The coolant then exits the outer annular passage 1242 at an outlet 1246 of the LED assembly 1200, as indicated by arrow 1248.

The outer portions 1214 and the inner portion 1216 of the heat exchanger 1212 include baffles 1260 (e.g., fins) configured to disrupt the flow of fluid in the coolant passages 1218, thereby facilitating a turbulent fluid flow at the heat exchanger 1212. In particular, each outer portion 1214 includes a base 1262 coupled to the substrate 1208 of a respective LED array 1206, and the baffles 1260 extend from the base 1262. Additionally, the inner portion 1216 includes a base 1270, and the baffles 1260 extend from the base 1270. As indicated by arrows 1280, the baffles 1260 may generate eddies at the heat exchanger 1212, thereby facilitating heat transfer between the LED arrays 1206 and the coolant flowing through the coolant passages 1218, as well as the inner annular passage 1240 generally. For example, as described above, the baffles 1260 may break up a potential laminar flow and cause warmer coolant to mix with cooler coolant at the inner annular passage 1240. In certain embodiments, the baffles 1260 may cause the coolant to reach and/or exceed a Reynolds number of 2,000. Accordingly, the heat exchanger 1212 may generate a turbulent flow that facilitates heat transfer between the LED arrays 1206 and the coolant. As illustrated, the baffles 1260 are straight and extend generally perpendicular from the base 1262 and the base 1270. In certain embodiments, the baffles 1260 may be other shapes and/or may include other geometries that are parallel to a fluid flow and/or that are disposed at an angle relative to the fluid flow to generate turbulence. For example, the baffles 1260 may extend at an oblique angle relative to the base 1262 and/or the base 1270.

After passing through the coolant passages 1218, the fluid may enter the end passage 1241 and transition from the turbulent flow to a laminar flow. For example, a size (e.g., a volume) of the end passage 1241 may be large enough to facilitate slowing the fluid and transitioning the fluid to the laminar flow. As the fluid enters the outer annular passage 1242, the fluid may be laminar. The fluid may cool the LEDs 1210 while in the laminar flow. Additionally, the laminar flow of the coolant in the outer annular passage 1242 may avoid and/or reduce deterioration of the LEDs 1210. In contrast, a turbulent flow in the outer annular passage 1242 may enhance deterioration of the LEDs 1210.

Figure 20:
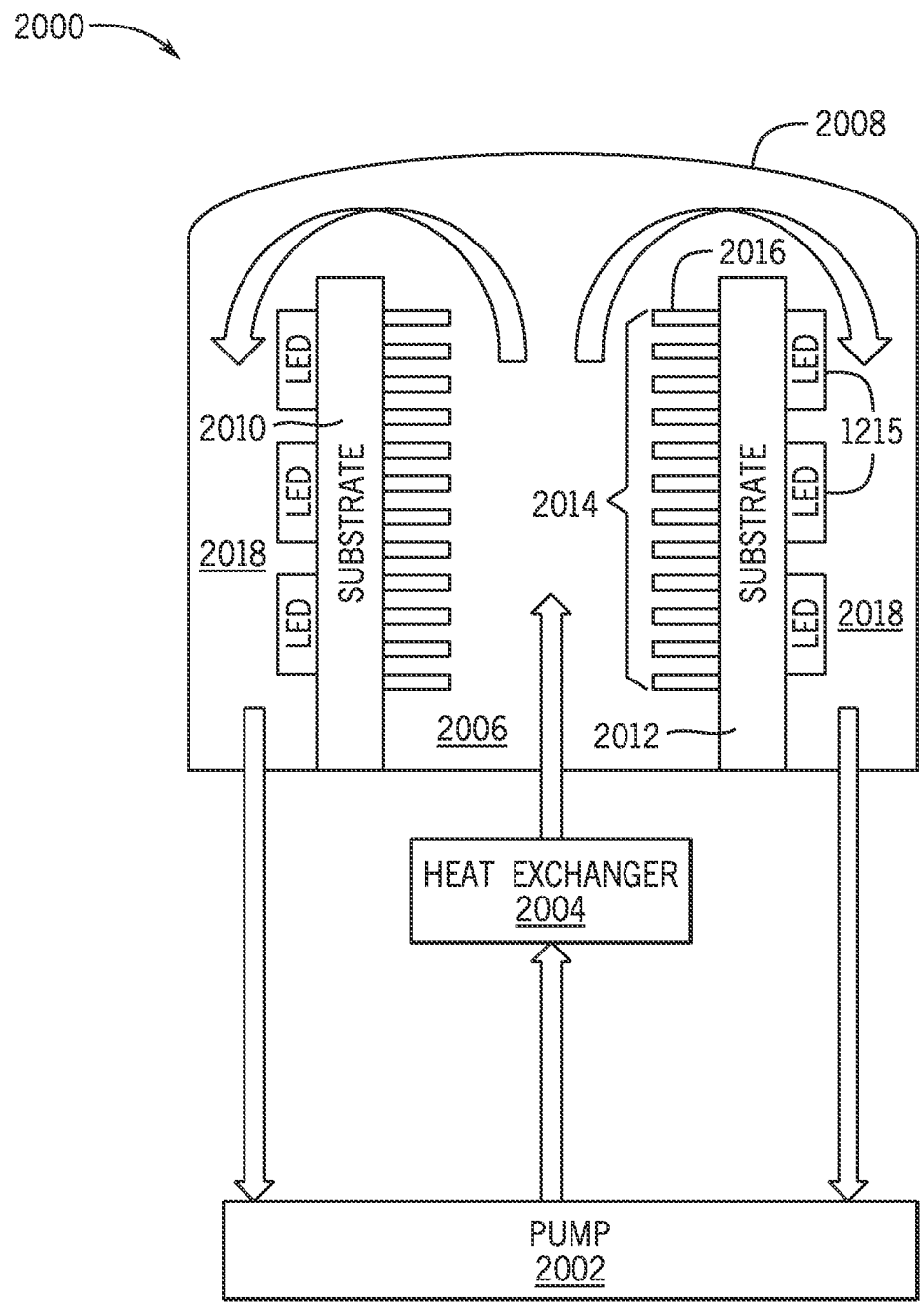
FIG. 20 is a schematic diagram of an embodiment of a coolant flow path via a cross-section of an LED assembly, in accordance with one or more current embodiments.

FIG. 20 is a schematic diagram of an embodiment of a coolant flow path via a cross-section of an LED assembly 2008 (e.g., LED device). Referring to FIG. 20, coolant is propelled via a pump 2002 into a first heat exchanger 2004 that removes heat from the coolant. The coolant cooled from the first heat exchanger 2004 enters a first chamber 2006 (e.g., an inner annular passage) of an LED assembly 2008. The first chamber 2006 may be formed, in part, by a first substrate 2010 and a second substrate 2012. Each of the first and second substrates 2010, 2012 may be attached to a respective second heat exchanger 2014, which forms part of the flow path of the coolant. The second heat exchanger 2014 is located on the opposite side of the substrates 2010 and 2012 from LEDs 2015 coupled to the substrates 2010 and 2012. The substrates 2010 and 2012 and the LEDs 2015 may form LED arrays of the LED assembly 2008. Although the second heat exchanger 2014 is illustrated as having fins 2016 (e.g., baffles) that are perpendicular to the flow path and perpendicular to the substrates 2010 and 2012, the fins 2016 may be arranged such that the length of the fins 2016 are arranged in parallel to the flow path. Other heat exchanger geometries as described above may also be used to create or promote turbulent flow of the coolant. For example, the fins 2016 may be disposed at an oblique angle relative to the substrates 2010 and 2012.

As coolant flows past the second heat exchangers 2014, the coolant then flows up to the top of the enclosure of the LED assembly 2008 (e.g., an end passage) and back down toward the sides of the LED assembly 2008 along the enclosure into a second chamber 2018 (e.g., an outer annular passage), further cooling the LEDs and the substrates simultaneously. The heated coolant then flows back to the pump 2002 and re-enters the first heat exchanger 2004 to be cooled. In this embodiment, the pump 2002 and the first heat exchanger 2004 may be switched in the thermal circuit, such that the heated coolant from the LED assembly 2008 first enters the first heat exchanger 2004 immediately after exiting the LED assembly 2008, and from the first heat exchanger 2004 then enters the pump 2002, which propels the cooled coolant into the first chamber 2006 of the LED assembly 2008. In certain embodiments, a cooling system 2000 may include the pump 2002, the first heat exchanger 2004, the second heat exchanger 2014, the LED assembly 2008, portion(s) of the LED assembly 2008, or any combination thereof.

In certain embodiments, the fins 2016 may generate and/or facilitate the turbulent fluid flow in the first chamber 2006, such as by causing mixing of the coolant in the first chamber 2006 and/or may reduce a boundary layer along the substrate 2012. As described above in reference to FIG. 19C, the flow of coolant may transition to a laminar flow at or prior to entering the second chamber 2018 to provide additional cooling to the LEDs 2015 while avoiding or reducing deterioration of the LEDs 2015 due to the coolant flow. In certain embodiments, a flow rate of the fluid through the first chamber 2006 may achieve a Reynold's number greater than 2,000, such that the flow rate facilitates turbulent flow of the fluid at the first chamber 2006 (e.g., in place of or in addition to turbulent flow generated via the fins 2016).

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A cooling system for a light emitting diode ("LED") assembly, comprising:
a fluid configured to absorb heat at the LED assembly;
a heat exchanger coupled to one or more substrates of the LED assembly, wherein the heat exchanger is configured to exchange heat between the LED assembly and the fluid; and
a pump configured to circulate the fluid along an inner annular passage through the heat exchanger generally toward an end passage formed between the LED assembly and an enclosure, through the end passage, into an outer annular passage formed between the LED assembly and the enclosure, and along the outer annular passage generally away from the end passage, wherein the fluid exhibits a turbulent flow at the LED assembly, the heat exchanger, or both, while circulated by the pump.

2. The cooling system of claim 1, comprising the LED assembly, wherein the LED assembly comprises at least one LED array configured to operate above a predetermined power density, wherein the predetermined power density is equal to or greater than 200 watts per square inch, and wherein the LED assembly has a surface area equal to or greater than 80 square inches.

3. The cooling system of claim 1, wherein the fluid exhibits the turbulent flow with a Reynold's number greater than 2,000.

4. The cooling system of claim 1, wherein the heat exchanger comprises:
a base configured to couple to the LED assembly; and
a plurality of baffles extending from the base, wherein the plurality of baffles are configured to generate the turbulent flow of the fluid.

5. The cooling system of claim 1, comprising the LED assembly, wherein the LED assembly comprises a plurality of LED arrays, and each LED array of the plurality of LED arrays comprises:
a substrate; and
a plurality of LEDs coupled to the substrate.

6. The cooling system of claim 5, wherein the heat exchanger comprises:
a plurality of outer portions coupled to the plurality of LED arrays, wherein each outer portion of the plurality of outer portions is coupled to the substrate of a respective LED array of the plurality of LED arrays;
an inner portion disposed in the plurality of outer portions; and
a plurality of baffles extending from the plurality of outer portions and the inner portion, where the plurality of baffles are configured to generate the turbulent flow of the fluid.

7. The cooling system of claim 5, wherein the heat exchanger comprises a plurality of fins extending from the substrate of each LED array of the plurality of LED arrays, and wherein the plurality of fins are configured to generate the turbulent flow of the fluid.

8. The cooling system of claim 7, wherein the plurality of fins extend perpendicular to the substrate of each LED array of the plurality of LED arrays.

9. The cooling system of claim 7, wherein the plurality of fins extend at an oblique angle relative to the substrate of each LED array of the plurality of LED arrays.

10. A light emitting diode (LED) device, comprising:
an LED assembly;
an inner annular passage formed within the LED assembly;
an enclosure configured to house the LED assembly;
an end passage formed between the LED assembly and the enclosure, wherein the end passage is fluidly coupled to the inner annular passage; and
an outer annular passage formed between the LED assembly and the enclosure, wherein the outer annular passage is configured to enable circulation of a fluid along the LED assembly and through a heat exchanger to absorb heat from the LED assembly, wherein the LED assembly is configured to be immersively disposed within the fluid, wherein the LED assembly is configured to emit light through the fluid and through the enclosure, wherein the fluid exhibits a turbulent flow while circulating through the LED assembly, and wherein the fluid is configured to circulate along the inner annular passage through the heat exchanger generally toward the end passage, through the end passage, into the outer annular passage, and along the outer annular passage generally away from the end passage.

11. The LED device of claim 10,
wherein the LED assembly is configured to be immersively disposed within the fluid at the inner annular passage, the end passage, and the outer annular passage, and wherein the outer annular passage is fluidly coupled to the inner annular passage.

12. The LED device of claim 10, wherein the fluid exhibits the turbulent flow with a Reynold's number greater than 2,000 while circulating through the inner annular passage.

13. The LED device of claim 10, wherein the fluid exhibits a laminar flow with a Reynold's number less than 2,000 while circulating through the outer annular passage.

14. The LED device of claim 10, wherein one or more LEDs of the LED assembly are configured to operate at 2 watts each for a duration greater than 1 minute.

15. The LED device of claim 10, wherein a range of a diameter of the LED assembly is 1 inch to 3 inches.

16. A light emitting diode ("LED") assembly, comprising:
a plurality of LED arrays, wherein each LED array of the plurality of LED arrays comprises:
a substrate; and
a plurality of LEDs coupled to the substrate; and
a heat exchanger coupled to the substrate of each LED array of the plurality of LED arrays, wherein the heat exchanger is configured to exchange heat between the plurality of LED arrays and a fluid, wherein the fluid exhibits a turbulent flow at the heat exchanger, and wherein the fluid is configured to circulate along an inner annular passage formed within the LED assembly through the heat exchanger generally toward an end passage formed between the LED assembly and an enclosure, through the end passage, into an outer annular passage formed between the LED assembly and the enclosure, and along the outer annular passage generally away from the end passage.

17. The LED assembly of claim 16, wherein the heat exchanger comprises:
   a plurality of bases, wherein each base of the plurality of bases is coupled to the substrate of a respective LED array of the plurality of LED arrays; and
   a plurality of baffles extending from the plurality of bases, wherein the plurality of baffles are configured to generate the turbulent flow of the fluid.

18. The LED assembly of claim 16, wherein the heat exchanger comprises a plurality of fins extending from the substrate of each LED array of the plurality of LED arrays, and wherein the plurality of fins are configured to generate the turbulent flow of the fluid.

19. The LED assembly of claim 16, wherein the fluid exhibits the turbulent flow with a Reynold's number greater than 2,000 at the heat exchanger.

20. The LED assembly of claim 16, wherein the fluid exhibits a laminar flow with a Reynold's number less than 2,000 while circulating across the plurality of LEDs of the plurality of LED arrays.

\* \* \* \* \*